(12) United States Patent
Karim

(10) Patent No.: US 12,141,470 B2
(45) Date of Patent: Nov. 12, 2024

(54) FEEDBACK FOR MULTI-LEVEL SIGNALING IN A MEMORY DEVICE

(71) Applicant: Lodestar Licensing Group LLC, Evanston, IL (US)

(72) Inventor: M. Ataul Karim, Boise, ID (US)

(*) Notice: Subject to any disclaimer, the term of this patent is extended or adjusted under 35 U.S.C. 154(b) by 0 days.

(21) Appl. No.: 18/403,512

(22) Filed: Jan. 3, 2024

(65) Prior Publication Data

US 2024/0256173 A1    Aug. 1, 2024

Related U.S. Application Data

(63) Continuation of application No. 18/056,520, filed on Nov. 17, 2022, now Pat. No. 11,880,591, which is a continuation of application No. 17/208,885, filed on Mar. 22, 2021, now Pat. No. 11,543,995.

(51) Int. Cl.
| | |
|---|---|
| G06F 3/06 | (2006.01) |
| G11C 11/22 | (2006.01) |
| G11C 11/4076 | (2006.01) |
| H03F 3/45 | (2006.01) |
| H03K 3/356 | (2006.01) |

(52) U.S. Cl.
CPC .......... G06F 3/0655 (2013.01); G06F 3/0604 (2013.01); G06F 3/0679 (2013.01); G11C 11/2293 (2013.01); G11C 11/4076 (2013.01); H03F 3/45179 (2013.01); H03K 3/356113 (2013.01); *G11C 11/221* (2013.01)

(58) Field of Classification Search
CPC .... G06F 3/0655; G06F 3/0604; G06F 3/0679; G11C 11/2293; G11C 11/4076; G11C 11/221; H03F 3/45179; H03K 3/356113

USPC .......................................... 711/154
See application file for complete search history.

(56) References Cited

U.S. PATENT DOCUMENTS

| | | | |
|---|---|---|---|
| 5,036,519 | A | 7/1991 | Ema et al. |
| 6,788,103 | B1 | 9/2004 | Feldman et al. |
| 9,542,991 | B1 * | 1/2017 | Xie ........................ G11C 7/109 |
| 10,412,798 | B2 | 9/2019 | Eum et al. |
| 10,628,624 | B1 * | 4/2020 | Keshavan ............. G06F 30/367 |

(Continued)

FOREIGN PATENT DOCUMENTS

DE    102018218445 A1    4/2020

OTHER PUBLICATIONS

Chinese Patent Office, "Office Action," issued in connection with Chinese Patent Application No. 202210275978.3 dated Mar. 10, 2023 (12 pages) (6 pages of English Translation and 6 pages of Original Document).

*Primary Examiner* — Fernando Hidalgo

(57) ABSTRACT

Methods, systems, and devices for feedback for multi-level signaling in a memory device are described. A receiver may use a modulation scheme to communicate information with a host device. The receiver may include a first circuit, a second circuit, a third circuit, and a fourth circuit. Each of the first circuit, the second circuit, the third circuit, and the fourth circuit may determine, for a respective clock phase, a voltage level of a signal modulated using the modulation scheme. The receiver may include a first feedback circuit, a second feedback circuit, a third feedback circuit, and a fourth feedback circuit. The first feedback circuit that may use information received from the first circuit at the first clock phase and modify the signal input into the second circuit for the second clock phase.

20 Claims, 9 Drawing Sheets

(56) References Cited

U.S. PATENT DOCUMENTS

| | | |
|---|---|---|
| 11,543,995 B2 | 1/2023 | Karim |
| 2007/0297209 A1 | 12/2007 | Hidaka |
| 2009/0010320 A1 | 1/2009 | Hollis |
| 2018/0136866 A1* | 5/2018 | Eugenio .................. G06F 11/22 |
| 2019/0097846 A1 | 3/2019 | Sreeramaneni et al. |
| 2019/0097848 A1* | 3/2019 | Taylor .................... H04L 25/06 |
| 2019/0356517 A1 | 11/2019 | Sreeramaneni et al. |
| 2020/0194043 A1 | 6/2020 | Karim |

* cited by examiner

FEEDBACK FOR MULTI-LEVEL SIGNALING IN A MEMORY DEVICE

CROSS REFERENCES

The present Application for Patent is a continuation of U.S. patent application Ser. No. 18/056,520 by Karim, et al., entitled "FEEDBACK FOR MULTI-LEVEL SIGNALING IN A MEMORY DEVICE", filed Nov. 17, 2022, which is a continuation of U.S. patent application Ser. No. 17/208,885 by Karim, et al., entitled "FEEDBACK FOR MULTI-LEVEL SIGNALING IN A MEMORY DEVICE", filed Mar. 22, 2021, each of which is assigned to the assignee hereof, and each of which is expressly incorporated by reference in its entirety herein.

FIELD OF TECHNOLOGY

The following relates generally to one or more systems for memory and more specifically to feedback for multi-level signaling in a memory device.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
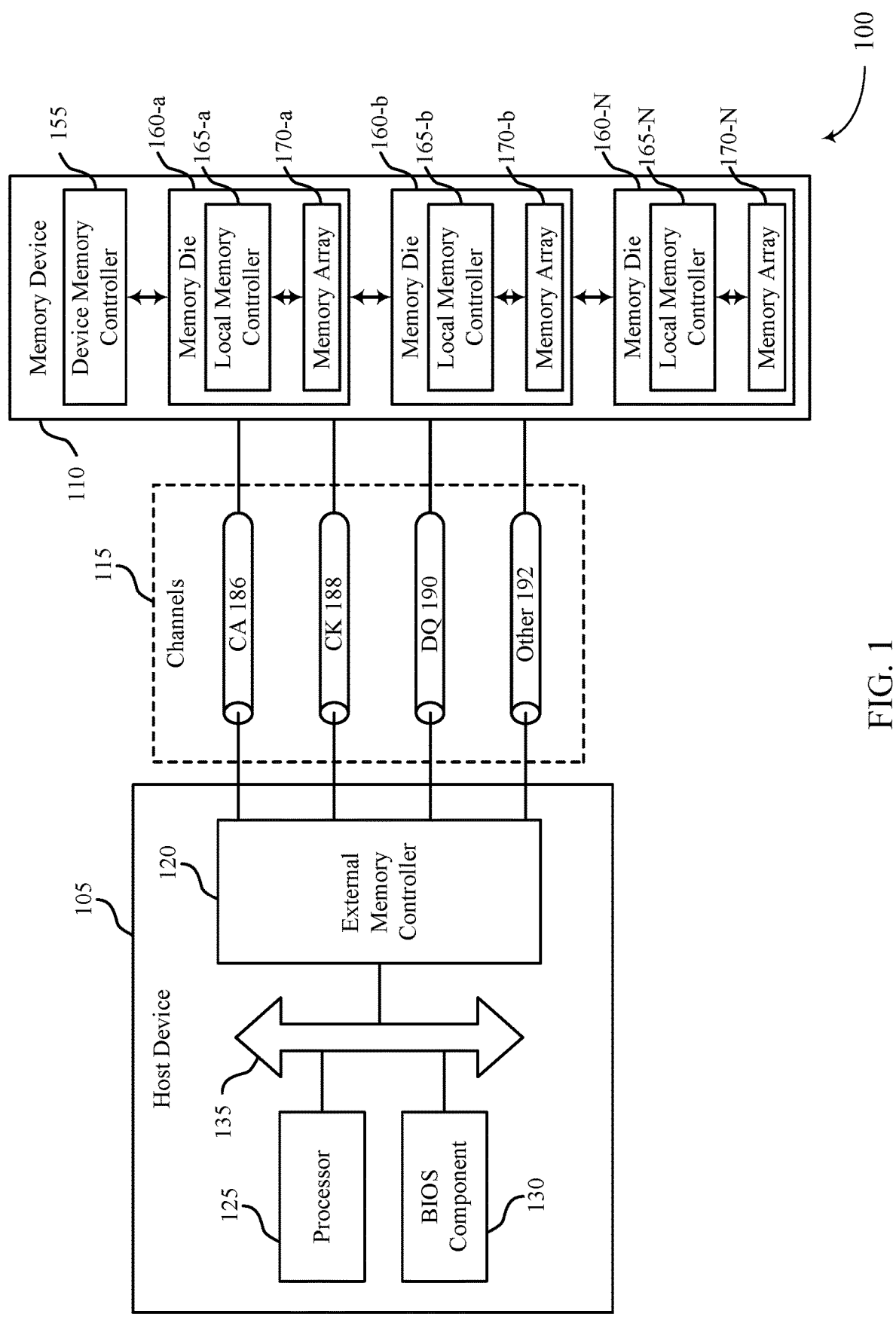
FIG. 1 illustrates an example of a system that supports feedback for multi-level signaling in a memory device in accordance with examples as disclosed herein.

Some memory devices may utilize a four-level pulse amplitude modulation (PAM4) scheme based on decision feedback equalization (DFE) or continuous time linear equalization (CTLE). In some cases, a signal communicated with the host device may be an example of a multi-level signal (e.g., a signal modulated using a modulation scheme that includes three or more symbols such as the PAM4 scheme). The PAM4 signal communicated with the host device may have inter-symbol interference (ISI), which may cause errors at the receiver in some cases. As such, ISI may decrease the integrity and detection of the signals. In some cases, the memory device may experience an increase in signal data rate during communication with the host device which may further contribute to the ISI. In such cases, the memory device may utilize an increased amount of circuit elements (e.g., transistors), which may use an increased amount of area of the memory device as compared to other components, thereby reducing an amount of space available on the memory die.

Such procedures that decrease channel bandwidth availability, which may result in an increase the ISI and an increase in signaling overhead for channels that experience crosstalk. Due to the ISI, the data rate through the channel may be limited. The presence of ISI within signals over channels to and from the memory device may increase the increase the energy in a following bit (e.g., a succeeding unit interval) and limit the data rate through the channel, thereby decreasing the efficiency of communications between the host device and the memory device. Such techniques may result in the memory device experiencing decreased channel utilization efficiency and a performance loss when performing memory device operations, which may increase the latency for other operations related to the memory system.

Systems, devices, and techniques for using a multi-phase architecture (e.g., four-phase) and a plurality of peaking circuits. To decode signals modulated using the modulation scheme and the multi-phase architecture, a memory device may include a receiver to process portions of an incoming signal in parallel. For example, a memory device may include a first circuit to identify symbols that are received at a first clock phase, a second circuit to identify symbols that are received at a second clock phase (e.g., that is immediately after the first clock phase), a third circuit to identify symbols that are received during a third clock phase (e.g., that is immediately after the second clock phase), and a fourth circuit to identify symbols that are received during a fourth clock phase (e.g., that is immediately after the third clock phase). The memory device may also include first, second, third, and fourth feedback circuits configured to facilitate feedback in the first, second, third, and fourth circuits, respectively, that are each configured to decode and modify signals that are modulated using the multi-level modulation scheme. A clock phase may refer to an instance in time (e.g., one of the four clock phases) that a receiver compares an input signal to one or more reference signals and thereby identify a candidate for data being communicated by the input signal.

In some cases, the receiver may include a plurality of amplifiers. The amplifiers may each be an example of a pre-amp (e.g., peaking) circuit that may include a transistor in an active inductor configuration. In such cases, the amplifier may be configured to increase the channel bandwidth and reduce the ISI associated with the signal. Memory devices that utilize the modulation scheme based on the DFE and including the plurality of amplifiers may be effective for increasing the bandwidth in the channels, thereby reducing the ISI in signals communicated with the host device. In such cases, the integrity and detection of the signals may increase. Reducing ISI may reduce the energy transferred to the next bits (e.g., succeeding unit intervals) and increase the data rate though the channel, thereby increasing the overall performance of the memory system.

Features of the disclosure are initially described in the context of systems and dies as described with reference to FIGS. 1 and 2. Features of the disclosure are described in the context of a circuit as described with reference to FIGS. 3-7. These and other features of the disclosure are further illustrated by and described with reference to an apparatus diagram and a flowchart that relate to feedback for multi-level signaling in a memory device as described with reference to FIGS. 8-9.

FIG. 1 illustrates an example of a system 100 that supports feedback for multi-level signaling in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. The host device 105 may refer to the hardware, firmware, software, or a combination thereof that implements the functions of an external memory controller 120. The external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. The external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

The memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. A memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. A CA channel 186 may include any quantity of signal paths to decode one or more of address or command data (e.g., eight or nine signal paths).

Clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. The clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

A multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, a modulation scheme may increase the rate of data transfer in channels. For example, the modulation scheme may be an example of a PAM4 modulation scheme. In some cases, implementing a PAM4 modulation scheme may be an alternative modulation scheme to using an NRZ modulation scheme. PAM4 signaling, however, may include more ISI than may be present in signals modulated using an NRZ modulation scheme. A receiver may be configured to account for and reduce the ISI. In such cases, the memory device may include a one-tap four-phase single ended PAM4 DFE that operates in a closed loop architecture, thereby increasing the overall power consumption of the memory device as compared to a memory device that operates without the DFE.

To implement such interference mitigation operations and reduce the power consumption, the receiver may include a first circuit to determine a voltage level of a signal modulated using a multi-level modulation scheme that includes three or more voltage levels (e.g., PAM4) at a first clock phase, a second circuit to determine a voltage level of the signal modulated using the multi-level modulation scheme at a second clock phase, a third circuit to determine a voltage level of the signal modulated using the multi-level modulation scheme at a third clock phase, and a fourth circuit to determine a voltage level of the signal modulated using the multi-level modulation scheme at a fourth clock phase. The closed loop architecture may be an example of the first circuit sending a feedback signal to the second circuit, the second circuit sending a feedback signal to the third circuit, the third circuit sending a feedback signal to the fourth circuit, and the fourth circuit sending a feedback signal to the first circuit.

Each of the circuits may be coupled with an amplifier. For example, the receiver may include a first amplifier, a second amplifier, a third amplifier, and a fourth amplifier. The amplifiers may receive a single ended PAM4 signal and convert the signal to a differential signal. Each amplifier may include a peaking circuit configured to reduce the ISI associated with the signal. In some examples, each peaking circuit may include a transistor in an active inductor configuration. For example, the active inductor configuration may introduce frequency dependent peaking, thereby reshaping the signal feeding into the DFE (e.g., the signal at a summing node of each circuit). For example, the amplifiers may be configured to decrease the ISI in a pulse response. In such cases, the ISI may be reduced, thereby improving the overall efficiency and operations of the memory device.

Figure 2:
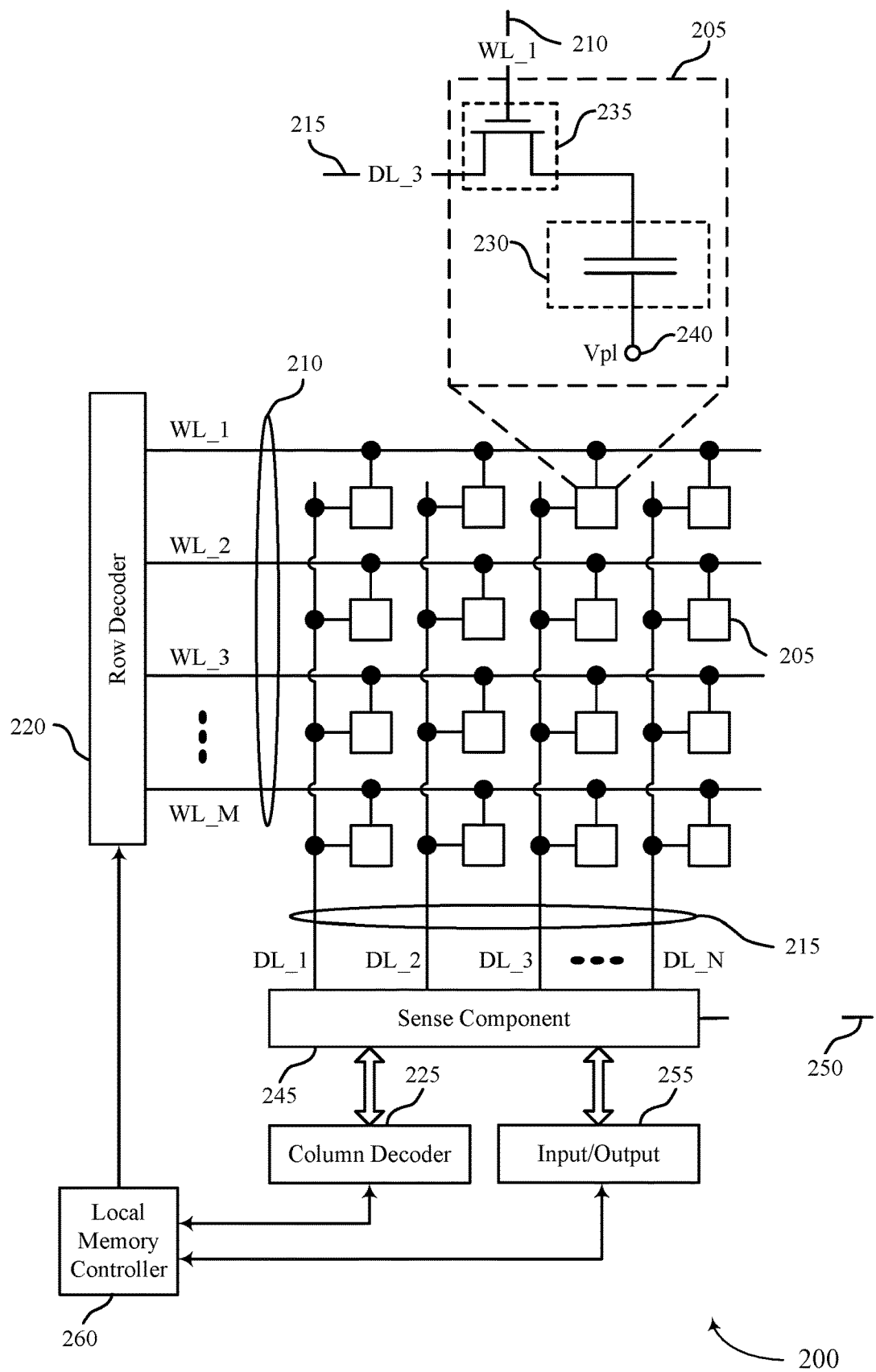
FIG. 2 illustrates an example of a memory die that supports feedback for multi-level signaling in a memory device in accordance with examples as disclosed herein.

FIG. 2 illustrates an example of a memory die 200 that supports feedback for multi-level signaling in a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0) or a logic 1). A memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. Word lines 210 may be referred to as row lines. Digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

The memory die 200 may be configured to store data received from a host device using signaling that is modulated using a multi-level modulation scheme (e.g., PAM4 modulation scheme). In such cases, the memory device may include a receiver that may be configured to mitigate the ISI using multiple feedback circuits, reduce power consumption (e.g., a closed loop DFE may consume less power than loop unrolled DFE), and increase the bandwidth of the memory device.

Figure 3:
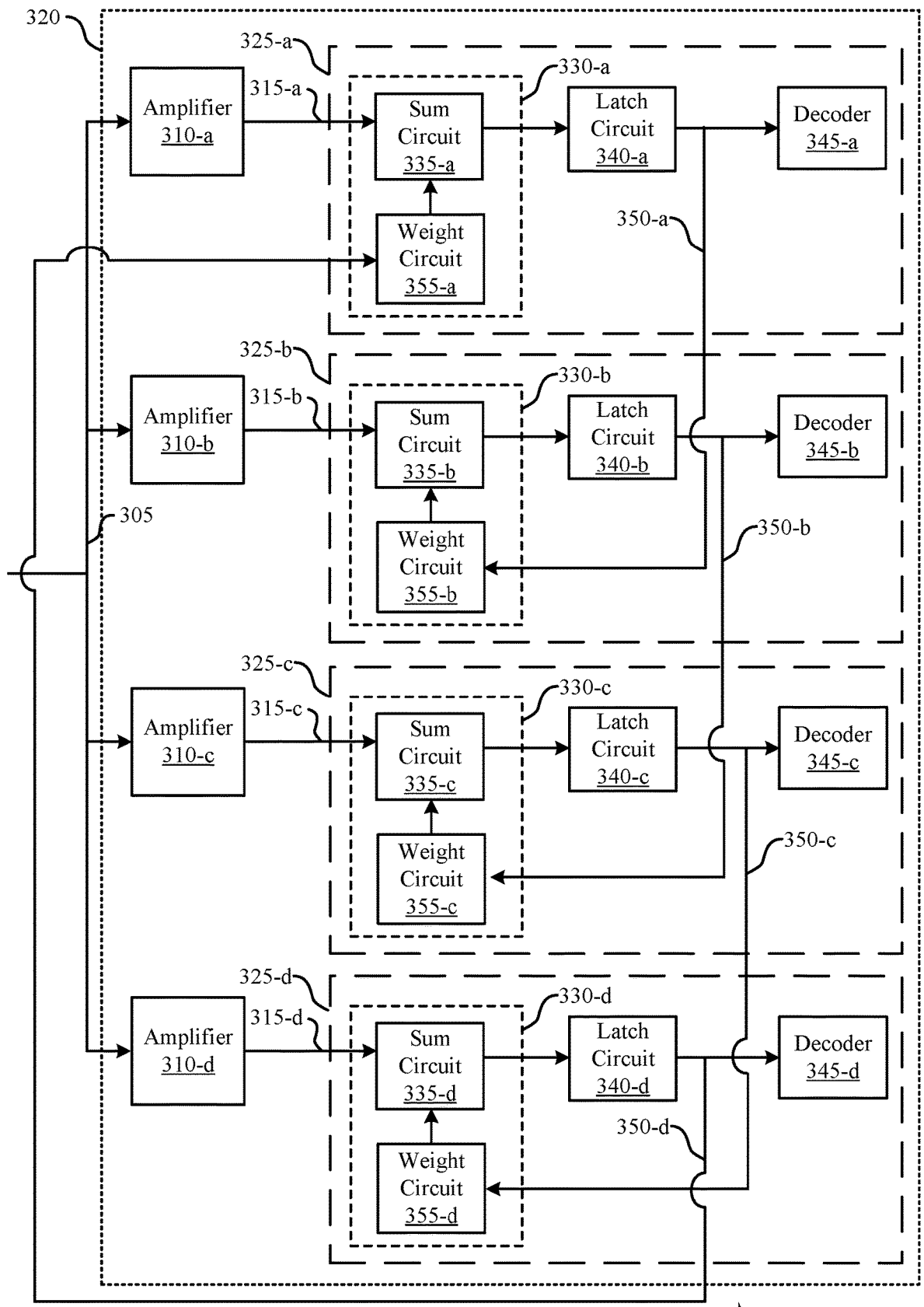
FIG. 3 illustrates an example of a circuit that supports feedback for multi-level signaling in a memory device in accordance with examples as disclosed herein.

FIG. 3 illustrates an example of a circuit 300 that supports feedback for multi-level signaling in a memory device in accordance with examples as disclosed herein. The circuit 300 may represent at least a portion of the memory devices 110 and memory dies 200 described with reference to FIGS. 1 and 2. Circuit 300 may include or be an example of a receiver 320. The receiver 320 may be incorporated into a memory device or a host device and may be coupled with a channel that extends between the memory device and the host device. The receiver 320 may include first amplifier 310-*a*, second amplifier 310-*b*, third amplifier 310-*c*, and fourth amplifier 310-*d*. The receiver 320 may include first circuit 325-*a*, second circuit 325-*b*, third circuit 325-*c*, and fourth circuit 325-*d*. First circuit 325-*a* may include feedback circuit 330-*a*, latch circuit 340-*a*, and decoder 345-*a*. Second circuit 325-*b* may include feedback circuit 330-*b*, latch circuit 340-*b*, and decoder 345-*b*. Third circuit 325-*c* may include feedback circuit 330-*c*, latch circuit 340-*c*, and decoder 345-*c*. Fourth circuit 325-*d* may include feedback circuit 330-*d*, latch circuit 340-*d*, and decoder 345-*d*. Circuit 300) is an example of a circuit that may modify the signal by a feedback circuit, as described with reference to FIGS. 1 and 2, among other aspects of the present disclosure.

In some systems, the bandwidth (e.g., data throughput) of a communication channel of the memory system may be increased by utilizing a modulation scheme that includes more levels or symbols than two, or may be increased by increasing the frequency of the signal, or both. Increasing the bandwidth may generate other issues that may reduce the effectiveness of solutions used to increase the data throughputs. For example, a channel loss may increase the ISI in the signal or may use higher power consumption components to provide better tolerances. In other examples, using higher frequencies may use higher power consumption components to account for the higher frequency operations. In some cases, the frequency of the signal may contribute to the ISI. Additionally or alternatively, when using higher frequencies or data rates, high-frequency circuit elements or high-power components may be used, which may increase an amount of area used by those components as compared to other lower-frequency components, thereby increasing a size and complexity of the memory die. In such cases, techniques to operate in a lower frequency range while also transmitting an increased amount of bits using multi-level modulation schemes are described.

For NRZ modulation schemes, the scheme may include two levels such that a single bit of digital data may be sent during a time period (or a unit interval). The value of the signal during a unit interval may be sampled at a clock phase by the receiver, which may then select a likely bit represented by the signal. For multi-level modulation schemes such as PAM4, by modulating the total amplitude or dividing the total amplitude of a voltage signal into four levels instead of two levels, the memory system can send two bits instead of one bit during the same time period. Using PAM4 instead of NRZ at the same frequency may double the data rate. In such cases, however, other challenges may arise from a channel loss including increased additional ISI, smaller sense windows for the additional voltage levels, and components that have tighter tolerances (and higher power consumption). One way to address some of these challenges is to reduce the frequency of signal (e.g., operate at half the frequency). In some cases, a multi-phase architecture (e.g., a four-phase architecture) may be used to maintain the frequency of the signal, but reduce the frequency of the components of the receiver. Such architectures may include an increased amount of transistors over other architectures, thereby increasing an amount of loads and input capacitance in the memory device. The transistors included in the multi-phase (e.g., four phase) architecture may be smaller than the transistors included in the two phase architecture, however, because of the lower operating frequencies (e.g., the more phases or legs of a receiver working in parallel then each leg may operate at slower speed or lower frequency).

In some cases, a receiver 320 may be parallelized into four phases (lanes or legs) (e.g., circuits 325) to decode the incoming signal and provide feedback between the different phases and reduce the ISI. Circuit 300 may be an example of a four-phase DFE architecture. For example, the feedback of the first phase (e.g., first circuit 325-*a*) may be passed to a second phase (e.g., second circuit 325-*a*), and the feedback of the second phase may be passed to a third phase (e.g., third circuit 325-*c*). The feedback of the third phase may be passed to a fourth phase (e.g., fourth circuit 325-*d*), and the feedback of the fourth phase may be passed to the first phase.

For example, circuit 300 may support signaling that uses a four phase architecture and a multi-level modulation scheme (e.g., PAM4). In such cases, circuit 300 may include first circuit 325-*a*, second circuit 325-*b*, third circuit 325-*c*, and fourth circuit 325-*d* parallel to each other for decoding a signal 305 received over a channel. In some cases, first circuit 325-*a*, second circuit 325-*b*, third circuit 325-*c*, and fourth circuit 325-*d* may each include equalization blocks. For example, the equalization blocks may include CTLE, Receiver Feed Forward Equalization (Rx-FFE), or DFE. In some examples, DFE may be used for reflection and cross-talk dominated channels (e.g., memory channels). The first circuit 325-*a*, the second circuit 325-*b*, the third circuit 325-*c*, and the fourth circuit 325-*d* each operate at a second frequency less than a first frequency associated with the signal 305 communicated over the channel. The second frequency may refer to an operating frequency at which the first circuit 325-*a*, the second circuit 325-*b*, the third circuit 325-*c*, and the fourth circuit 325-*d* receive signals 315 and generate feedbacks signals 350. For example, the second frequency may be a fourth of the frequency with which the latch circuits 340 may be operating at. In some cases, the signal 305 communicated over the channel is communicated at a first frequency. The first frequency may refer to a signal frequency (e.g., data rate) associated with the signal 305 received at each amplifier 310.

Amplifiers 310-*a*, 310-*b*, 310-*c*, and 310-*d* may be configured to receive a signal 305 over a channel coupled with a host device or a memory device. In some examples, signal 305 may be a single-ended signal. Amplifiers 310-*a*, 310-*b*, 310-*c*, and 310-*d* may be configured to output a differential signal based on receiving a single-ended signal. In some examples, the amplifiers 310-*a*, 310-*b*, 310-*c*, and 310-*d* may output single-ended signals. Amplifier 310-*a* may be coupled to the first circuit 325-*a* and may be configured to generate and output the signal 315-*a* to the first circuit 325-*a*. Amplifier 310-*b* may be coupled to the second circuit 325-*b* and may be configured to generate and output the signal 315-*b* to the second circuit 325-*b*. Amplifier 310-*c* may be coupled to the third circuit 325-*c* and may be configured to generate and output the signal 315-*c* to the third circuit 325-*c*. Amplifier 310-*d* may be coupled to the fourth circuit 325-*d* and may be configured to generate and output the signal 315-*d* to the fourth circuit 325-*d*.

In some cases, the receiver 320 may include an amplifier 310 coupled with each phase (e.g., circuit 325) such that the receiver 320 may include four amplifiers 310. The amplifiers 310 may reduce the ISI, thereby reducing the size of components and the memory die and reducing the overall cost of the memory die. Reducing the ISI may increase an area of an eye diagram associated with signals 315 such that the receiver 320 may be able to detect the levels with a decreased quantity of errors. The output node of the amplifiers 310 may be an example of a summing node. In such cases, the output node of the amplifiers 310 may sum the differential output of the amplifier 310 and the signal from the weight circuit 355 (e.g., CML tap circuit).

Each amplifier 310 may include a peaking circuit configured to reduce the ISI associated with the signal 305. For example, the ISI may be reduced between a first clock phase and a second clock phase, between a second clock phase and a third clock phase, and between a third clock phase and a fourth clock phase. A clock phase may refer to an instance in time (one of the four clock phases) that a receiver compares an input signal to one or more reference signals and thereby identify a candidate for data being communicated by the input signal. Each peaking circuit may include a transistor in an active inductor configuration. For example, the active inductor configuration may introduce frequency dependent peaking, thereby reshaping the signal 305 that is sent to the DFE (e.g., the signal at a summing node of each circuit). For example, the amplifiers 310 may be configured to decrease the energy to the next bits (e.g., signal 305). In such cases, the ISI may be reduced, thereby improving the overall efficiency and operations of the memory device. Some features of the amplifiers 310-a, 310-b, 310-c, and 310-d are described in more detail with reference to FIG. 4.

Signals 315-a, 315-b, 315-c, and 315-d may each be examples of a differential signal. In some cases, the signals 315-a. 315-b, 315-c, and 315-d may each be examples of a single-ended signal. In some cases, the signals 315-a. 315-b, 315-c, and 315-d may be the same signal. In some cases, signals 315-a, 315-b, 315-c, and 315-d may each be modulated using a multi-level modulation scheme (e.g., PAM4) and may include a remaining portion of the ISI after being communicated over the channel. In some examples, a linear driver may generate the differential PAM4 signal.

In some case, amplifier 310-a may be coupled with feedback circuit 330-a. Feedback circuit 330-a may include sum circuit 335-a and weight circuit 355-a. In such cases, sum circuit 335-a may be coupled with the amplifier 310-a. Feedback circuit 330-a may be coupled with latch circuit 340-a. For example, sum circuit 335-a may be coupled with latch circuit 340-a. Latch circuit 340-a may include a strongARM latch (e.g., a strong arm based differential slicer). A sampling event may occur at the latch circuit 340-a. For example, the latch circuit 340-a may slice the differential signal at a first clock phase (e.g., 0°) clock phase). In some examples, latch circuit 340-a may be coupled with decoder 345-a. Decoder 345-a may be an example of, but is not limited to, a thermometer code decoder.

In some case, the amplifier 310-b may be coupled with feedback circuit 330-b. Feedback circuit 330-b may include sum circuit 335-b and weight circuit 355-b. In such cases, sum circuit 335-b may be coupled with the amplifier 310-b. Feedback circuit 330-b may be coupled with latch circuit 340-b. For example, sum circuit 335-b may be coupled with latch circuit 340-b. Latch circuit 340-b may include a strongARM latch (e.g., a strong arm based differential slicer). A sampling event may occur at the latch circuit 340-b. For example, the latch circuit 340-b may slice the differential signal at a second clock phase (e.g., 90° clock phase). In some examples, latch circuit 340-b may be coupled with decoder 345-b. Decoder 345-b may be an example of, but is not limited to, a thermometer code decoder.

The amplifier 310-c may be coupled with feedback circuit 330-c. Feedback circuit 330-c may include sum circuit 335-c and weight circuit 355-c. In such cases, sum circuit 335-c may be coupled with the amplifier 310-c. Feedback circuit 330-c may be coupled with latch circuit 340-c. For example, sum circuit 335-c may be coupled with latch circuit 340-c. Latch circuit 340-c may include a strongARM latch (e.g., a strong arm based differential slicer). A sampling event may occur at the latch circuit 340-c. For example, the latch circuit 340-c may slice the differential signal at a third clock phase (e.g., 180° clock phase). In some examples, latch circuit 340-c may be coupled with decoder 345-c. Decoder 345-c may be an example of, but is not limited to, a thermometer code decoder.

The amplifier 310-d may be coupled with feedback circuit 330-d. Feedback circuit 330-d may include sum circuit 335-d and weight circuit 355-d. In such cases, sum circuit 335-d may be coupled with the amplifier 310-d. Feedback circuit 330-d may be coupled with latch circuit 340-d. For example, sum circuit 335-d may be coupled with latch circuit 340-d. Latch circuit 340-d may include a strongARM latch (e.g., a strong arm based differential slicer). A sampling event may occur at the latch circuit 340-d. For example, the latch circuit 340-d may slice the differential signal at a third clock phase (e.g., 270° clock phase). In some examples, latch circuit 340-d may be coupled with decoder 345-d. Decoder 345-d may be an example of, but is not limited to, a thermometer code decoder.

In some cases, signals 315-a. 315-b, 315-c, and 315-d may modulated using a modulation scheme that includes four symbols, where each symbol may be represented by a voltage level. The voltage level may refer to a voltage difference between each of the signals 315-a. 315-b, 315-c, and 315-d and ground voltage and thereby identifies the voltage of each the signals 315-a, 315-b, 315-c, and 315-d. For multi-level modulation schemes such as PAM4, the total amplitude of the voltage signal may be divided into four levels (e.g., voltage levels). For example, the multi-level modulation scheme may include signal level L0, L1, L2, and L3. Signals 315-a. 315-b, 315-c, and 315-d may be one or more differential signals. The signals 315-a, 315-b, 315-c, and 315-d may include a true signal (e.g., P signal) and a complement signal (e.g., N signal). The P signal may be at signal level L3, and the corresponding N signal may be at signal level L0. In other examples, the P signal may be at signal level L2, and the corresponding N signal may be at signal level L1. In some cases, the P signal may be at signal level L1, and the corresponding N signal may be at signal level L2.

In some cases, the amplifier 310-a may be coupled with the input of the first circuit 325-a. For example, the amplifier 310-a may receive signal 305 and output signal 315-a. First circuit 325-a may be configured to determine the symbol or voltage level of the signal 315-a at a particular clock phase different than other clock phases determined by other circuits 325. In some cases, first circuit 325-a may determine the voltage level of the signal that occurs at a first clock phase based on reducing the ISI.

Sum circuit 335-a may receive the signal from the amplifier 310-a and output the signal to latch circuit 340-a. Sum circuit 335-a may be an example of a summing node configured to sum a main signal (e.g., signal 315-a) and a feedback signal (e.g., feedback signal 350-d). Latch circuit 340-a may compare the signal to one or more different reference voltages. For example, latch circuit 340-a may include one or more latch circuits where each latch circuit compares the signal to a different reference voltage. The quantity of latch circuits in the latch circuit 340-a may be based on the quantity of symbols included in the modulation scheme. For example, for a PAM4 scheme, the latch circuit 340-a may include three latch circuits to distinguish some or all of the different levels that may be present in a signal. As described herein in further detail, the latch circuit 340-*a* may generate feedback signal 350-*a* based on comparing the signal to a reference voltage. Feedback signal 350-*a* may be an example of a differential signal.

The feedback signal 350-*a* may include the output of the latch circuit 340-*a*. In some examples, the feedback signal 350-*a* may include one or more different signals. Each signal may output for a specific latch circuit of the latch circuit 340-*a*. In some cases, each signal in the feedback signal may be an example of a differential signal that is modulated using a two-level modulation scheme. In some cases, a selective biasing technique may be used to slice the P signal and the N signal (e.g., the two parts of a differential signal) at two different voltage levels. For example, a single latch may be configured to compare the P signal to a first reference voltage and compare the N signal to a different reference voltage. In some cases, decoder 345-*a* may receive feedback signal 350-*a* from latch circuit 340-*a*. For example, decoder 345-*a* may determine a symbol associated with the signal transmitted during the first clock phase based on the feedback signal 350-*a*. In some examples, the feedback signal 350-*a* may include one or more differential signals. In such examples, a selective biasing technique may be used to slice the incoming single-ended signals and generate the feedback signals.

In some cases, the amplifier 310-*b* may be coupled with the input of the second circuit 325-*b*. For example, the amplifier 310-*b* may receive signal 305 and output signal 315-*b*. Second circuit 325-*b* may be configured to determine symbol or voltage level of the signal 315-*b* at a particular clock phase different than other clock phases determined by other circuits 325. In some cases, second circuit 325-*b* may determine the voltage level of the signal that occurs at the second clock phase based on feedback circuit 330-*a* modifying the signal input into the second circuit 325-*b*.

Sum circuit 335-*b* may receive the signal from the amplifier 310-*b* and output the signal to latch circuit 340-*b*. Sum circuit 335-*b* may be an example of a summing node configured to sum a main signal (e.g., signal 315-*b*) and a feedback signal (e.g., feedback signal 350-*a*). Latch circuit 340-*b* may compare the signal to one or more different reference voltages. For example, latch circuit 340-*b* may include one or more latch circuits where each latch circuit compares the signal to a different reference voltage. The quantity of latch circuits in the latch circuit 340-*b* may be based on the quantity of symbols included in the modulation scheme. For example, for a PAM4 scheme, the latch circuit 340-*b* may include three latch circuits to distinguish some or all of the different levels that may be present in a signal. As described herein in further detail, the latch circuit 340-*b* may generate feedback signal 350-*b* based on comparing the signal to a reference voltage. Feedback signal 350-*b* may be an example of a differential signal.

The feedback signal 350-*b* may comprise the output of the latch circuit 340-*b*. In some examples, the feedback signal 350-*b* may include one or more different signals. Each signal may output for a specific latch circuit of the latch circuit 340-*b*. In some cases, each signal in the feedback signal may be an example of a differential signal that is modulated using a two-level modulation scheme. In some cases, a selective biasing technique may be used to slice the P signal and the N signal (e.g., the two parts of a differential signal) at two different voltage levels. For example, a single latch may be configured to compare the P signal to a first reference voltage and compare the N signal to a different reference voltage. In some cases, decoder 345-*b* may receive feedback signal 350-*b* from latch circuit 340-*b*. For example, decoder 345-*b* may determine a symbol associated with the signal transmitted during the second clock phase based on the feedback signal 350-*b*. In some examples, the feedback signal 350-*b* may include one or more differential signals. In such examples, a selective biasing technique may be used to slice the incoming single-ended signals and generate the feedback signals.

In some cases, the amplifier 310-*c* may be coupled with the input of the third circuit 325-*c*. For example, the amplifier 310-*c* may receive signal 305 and output signal 315-*c*. Third circuit 325-*c* may be configured to determine symbol or voltage level of the signal 315-*c* at a particular clock phase different than other clock phases determined by other circuits 325. In some cases, third circuit 325-*c* may determine the voltage level of the signal that occurs at the third clock phase based on feedback circuit 330-*b* modifying the signal input into the third circuit 325-*c*.

Sum circuit 335-*c* may receive the signal from the amplifier 310-*c* and output the signal to latch circuit 340-*c*. Sum circuit 335-*c* may be an example of a summing node configured to sum a main signal (e.g., signal 315-*c*) and a feedback signal (e.g., feedback signal 350-*b*). Latch circuit 340-*c* may compare the signal to one or more different reference voltages. For example, latch circuit 340-*c* may include one or more latch circuits where each latch circuit compares the signal to a different reference voltage. The quantity of latch circuits in the latch circuit 340-*c* may be based on the quantity of symbols included in the modulation scheme. For example, for a PAM4 scheme, the latch circuit 340-*c* may include three latch circuits to distinguish some or all of the different levels that may be present in a signal. As described herein in further detail, the latch circuit 340-*c* may generate feedback signal 350-*c* based on comparing the signal to a reference voltage. Feedback signal 350-*c* may be an example of a differential signal.

The feedback signal 350-*c* may comprise the output of the latch circuit 340-*c*. In some examples, the feedback signal 350-*c* may include one or more different signals. Each signal may output for a specific latch circuit of the latch circuit 340-*b*. In some cases, each signal in the feedback signal may be an example of a differential signal that is modulated using a two-level modulation scheme. In some cases, a selective biasing technique may be used to slice the P signal and the N signal (e.g., the two parts of a differential signal) at two different voltage levels. For example, a single latch may be configured to compare the P signal to a first reference voltage and compare the N signal to a different reference voltage. In some cases, decoder 345-*c* may receive feedback signal 350-*c* from latch circuit 340-*c*. For example, decoder 345-*c* may determine a symbol associated with the signal transmitted during the third clock phase based on the feedback signal 350-*c*. In some examples, the feedback signal 350-*c* may include one or more differential signals. In such examples, a selective biasing technique may be used to slice the incoming single-ended signals and generate the feedback signals In some cases, the amplifier 310-*d* may be coupled with the input of the fourth circuit 325-*d*. For example, the amplifier 310-*d* may receive signal 305 and output signal 315-*d*. Fourth circuit 325-*d* may be configured to determine symbol or voltage level of the signal 315-*d* at a particular clock phase different than other clock phases determined by other circuits 325. In some cases, fourth circuit 325-*d* may determine the voltage level of the signal that occurs at the fourth clock phase based on feedback circuit 330-*c* modifying the signal input into the fourth circuit 325-*d*.

Sum circuit 335-*d* may receive the signal from the amplifier 310-*d* and output the signal to latch circuit 340-*d*. Sum circuit 335-*d* may be an example of a summing node configured to sum a main signal (e.g., signal 315-*d*) and a feedback signal (e.g., feedback signal 350-*c*). Latch circuit 340-*d* may compare the signal to one or more different reference voltages. For example, latch circuit 340-*d* may include one or more latch circuits where each latch circuit compares the signal to a different reference voltage. The quantity of latch circuits in the latch circuit 340-*d* may be based on the quantity of symbols included in the modulation scheme. For example, for a PAM4 scheme, the latch circuit 340-*d* may include three latch circuits to distinguish some or all of the different levels that may be present in a signal. As described herein in further detail, the latch circuit 340-*d* may generate feedback signal 350-*d* based on comparing the signal to a reference voltage. Feedback signal 350-*d* may be an example of a differential signal.

The feedback signal 350-*d* may comprise the output of the latch circuit 340-*d*. In some examples, the feedback signal 350-*d* may include one or more different signals. Each signal may output for a specific latch circuit of the latch circuit 340-*d*. In some cases, each signal in the feedback signal may be an example of a differential signal that is modulated using a two-level modulation scheme. In some cases, a selective biasing technique may be used to slice the P signal and the N signal (e.g., the two parts of a differential signal) at two different voltage levels. For example, a single latch may be configured to compare the P signal to a first reference voltage and compare the N signal to a different reference voltage. In some cases, decoder 345-*d* may receive feedback signal 350-*d* from latch circuit 340-*d*. For example, decoder 345-*d* may determine a symbol associated with the signal transmitted during the fourth clock phase based on the feedback signal 350-*d*. In some examples, the feedback signal 350-*d* may include one or more differential signals. In such examples, a selective biasing technique may be used to slice the incoming single-ended signals and generate the feedback signals.

Signals received by the circuit 300 may include some amount of ISI. The feedback circuits 330-*a*, 330-*b*, 330-*c*, and 330-*d* may be configured to reduce or correct for the ISI and thereby improve the quality of the signal before it is latched and decoded. The feedback circuit 330-*a* may be configured to take the outputs of a first clock phase and feed that information back to the second circuit 325-*b* to compensate for ISI in the signal at a subsequent clock phase (e.g., a second clock phase). In some cases, the feedback circuit 330-*a* may be configured to take the outputs of a first clock phase and feed that information back to the second circuit 325-*b*, the third circuit 325-*c*, or the fourth circuit 325-*d*, in any combination of subsequent circuits to compensate for ISI in the signal at any set of clock phases that occur after the first clock phase associated with the first circuit 325-*a*. In some cases, feedback circuits 330 (including feedback circuit 330-*a*) may include one or more delay circuits to facilitate the feedback signals to the one or more clock phases that occur after the first clock phase. The delay circuits may delay the feedback signal 350-*a* generated at the first clock phase.

The feedback circuit 330-*b* may be configured to take the outputs of a second clock phase and feed that information back to the third circuit 325-*c* to compensate for ISI in the signal at a subsequent clock phase (e.g., a third clock phase). In some cases, the feedback circuit 330-*b* may be configured to take the outputs of a second clock phase and feed that information back to the third circuit 325-*c*, the fourth circuit 325-*d*, or the first circuit 325-*a*, in any combination of subsequent circuits to compensate for ISI in the signal at any set of clock phases that occur after the second clock phase associated with the second circuit 325-*b*. In some cases, feedback circuits 330) (including feedback circuit 330-*b*) may include one or more delay circuits to facilitate the feedback signals to the one or more clock phases that occur after the second clock phase. The delay circuits may delay the feedback signal 350-*b* generated at the second clock phase.

The feedback circuit 330-*c* may be configured to take the outputs of a third clock phase and feed that information back to the fourth circuit 325-*d* to compensate for ISI in the signal at a subsequent clock phase (e.g., a fourth clock phase). In some cases, the feedback circuit 330-*c* may be configured to take the outputs of a third clock phase and feed that information back to the fourth circuit 325-*d*, the first circuit 325-*a*, or the second circuit 325-*b*, in any combination of subsequent circuits to compensate for ISI in the signal at any set of clock phases that occur after the third clock phase associated with the third circuit 325-*c*. In some cases, feedback circuits 330 (including feedback circuit 330-*c*) may include one or more delay circuits to facilitate the feedback signals to the one or more clock phases that occur after the third clock phase. The delay circuits may delay the feedback signal 350-*c* generated at the third clock phase.

The feedback circuit 330-*d* may be configured to take the outputs of a fourth clock phase and feed that information back to the first circuit 325-*a* to compensate for ISI in the signal at a subsequent clock phase (e.g., a first clock phase). In some cases, the feedback circuit 330-*d* may be configured to take the outputs of a third clock phase and feed that information back to the first circuit 325-*a*, the second circuit 325-*b*, or the third circuit 325-*c*, in any combination of subsequent circuits to compensate for ISI in the signal at any set of clock phases that occur after the fourth clock phase associated with the fourth circuit 325-*d*. In some cases, feedback circuits 330 (including feedback circuit 330-*d*) may include one or more delay circuits to facilitate the feedback signals to the one or more clock phases that occur after the fourth clock phase. The delay circuits may delay the feedback signal 350-*d* generated at the fourth clock phase.

In some examples, the voltage level of the signal determined by first circuit 325-*a* may be based on feedback circuit 330-*a* causing the signal to be modified based on the output of a preceding clock phase (or two or more preceding clock phases). For example, feedback circuit 330-*a* may be coupled with the output of fourth circuit 325-*d* (e.g., feedback signal 350-*d*) and the input of first circuit 325-*a* (e.g., signal 315-*a*). Feedback circuit 330-*a* may receive, from fourth circuit 325-*d* and/or the latch circuit 340-*d*, feedback signal 350-*d*. Feedback signal 350-*d* may indicate information about the voltage level of a preceding clock phase.

Feedback circuit 330-*a* may modify the signal 315-*a* input into first circuit 325-*a* based on feedback signal 350-*d*. In such cases, feedback circuit 330-*a* may equalize a multi-level signal. For example, feedback circuit 330-*a* may include weight circuit 355-*a*. Weight circuit 355-*a* may apply a different feedback signal to the signal. In some cases, weight circuit 355-*a* may include one or more tap circuits to weight the feedback signal 350-*d* according to a feedback parameter. The weight circuit 355-*a* may multiply the feedback signal 350-*d* by a tap weight. In some cases, the DFE tap value of the weight circuit 355-*a* (e.g., tap weight) may be controlled by the tail current of the tap circuits included in the weight circuit 355-*a*. For example, weight circuit 355-*a* may be coupled with sum circuit 335-*a* and latch circuit 340-*d* (e.g., to receive feedback signal 350-*d*). In some cases, feedback circuit 330-*a* may include a delay circuit. The delay circuit may delay the feedback signal at least one clock phase. In some cases, the delay circuit may be coupled with weight circuit 355-*a*. Feedback circuit 330-*a* may also utilize a full rate clock architecture.

In some cases, the feedback circuit 330-*a* coupled with an input of the second circuit 325-*b* and an output of the first circuit 325-*a* may be configured to modify the signal input into the second circuit 325-*b* based on the feedback signal 350-*a*. In such cases, the signal sent to the second circuit 325-*b* is modified based on comparing the signal with the reference voltages and determining the voltage level that occurs at the first clock phase.

In some examples, the voltage level of the signal determined by second circuit 325-*b* may be based on feedback circuit 330-*b* causing the signal to be modified based on the output of a preceding clock phase (or two or more preceding clock phases). For example, feedback circuit 330-*b* may be coupled with the output of first circuit 325-*a* (e.g., feedback signal 350-*a*) and the input of second circuit 325-*b* (e.g., signal 315-*b*). Feedback circuit 330-*b* may receive, from first circuit 325-*a* and/or the latch circuit 340-*a*, feedback signal 350-*a*. Feedback signal 350-*a* may indicate information about the voltage level of a preceding clock phase.

Feedback circuit 330-*b* may modify the signal 315-*b* input into second circuit 325-*b* based on feedback signal 350-*a*. In such cases, feedback circuit 330-*b* may equalize a multi-level signal. For example, feedback circuit 330-*b* may include weight circuit 355-*b*. Weight circuit 355-*b* may apply a different feedback signal to the signal. In some cases, weight circuit 355-*b* may include one or more tap circuits to weight the feedback signal 350-*a* according to a feedback parameter. The weight circuit 355-*b* may multiply the feedback signal 350-*a* by a tap weight. In some cases, the DFE tap value of the weight circuit 355-*b* (e.g., tap weight) may be controlled by the tail current of the tap circuits included in the weight circuit 355-*b*. For example, weight circuit 355-*b* may be coupled with sum circuit 335-*b* and latch circuit 340-*a* (e.g., to receive feedback signal 350-*a*). In some cases, feedback circuit 330-*b* may include a delay circuit. The delay circuit may delay the feedback signal at least one clock phase. In some cases, the delay circuit may be coupled with weight circuit 355-*b*. Feedback circuit 330-*b* may also utilize a full rate clock architecture.

In some cases, the feedback circuit 330-*b* coupled with an input of the third circuit 325-*c* and an output of the second circuit 325-*b* may be configured to modify the signal input into the third circuit 325-*b* based on the feedback signal 350-*b*. In such cases, the signal sent to the third circuit 325-*c* is modified based on comparing the signal with the reference voltages and determining the voltage level that occurs at the second clock phase.

In some examples, the voltage level of the signal determined by third circuit 325-*c* may be based on feedback circuit 330-*c* causing the signal to be modified based on the output of a preceding clock phase (or two or more preceding clock phases). For example, feedback circuit 330-*c* may be coupled with the output of second circuit 325-*b* (e.g., feedback signal 350-*b*) and the input of third circuit 325-*c* (e.g., signal 315-*c*). Feedback circuit 330-*c* may receive, from second circuit 325-*b* and/or the latch circuit 340-*b*, feedback signal 350-*b*. Feedback signal 350-*b* may indicate information about the voltage level of a preceding clock phase.

Feedback circuit 330-*c* may modify the signal 315-*c* input into third circuit 325-*c* based on feedback signal 350-*b*. In such cases, feedback circuit 330-*c* may equalize a multi-level signal. For example, feedback circuit 330-*c* may include weight circuit 355-*c*. Weight circuit 355-*c* may apply a different feedback signal to the signal. In some cases, weight circuit 355-*c* may include one or more tap circuits to weight the feedback signal 350-*b* according to a feedback parameter. The weight circuit 355-*c* may multiply the feedback signal 350-*b* by a tap weight. In some cases, the DFE tap value of the weight circuit 355-*c* (e.g., tap weight) may be controlled by the tail current of the tap circuits included in the weight circuit 355-*c*. For example, weight circuit 355-*c* may be coupled with sum circuit 335-*c* and latch circuit 340-*b* (e.g., to receive feedback signal 350-*b*). In some cases, feedback circuit 330-*c* may include a delay circuit. The delay circuit may delay the feedback signal at least one clock phase. In some cases, the delay circuit may be coupled with weight circuit 355-*c*. Feedback circuit 330-*c* may also utilize a full rate clock architecture.

In some cases, the feedback circuit 330-*c* coupled with an input of the fourth circuit 325-*d* and an output of the third circuit 325-*c* may be configured to modify the signal input into the fourth circuit 325-*d* based on the feedback signal 350-*c*. In such cases, the signal sent to the fourth circuit 325-*d* is modified based on comparing the signal with the reference voltages and determining the voltage level that occurs at the third clock phase.

In some examples, the voltage level of the signal determined by fourth circuit 325-*d* may be based on feedback circuit 330-*d* causing the signal to be modified based on the output of a preceding clock phase (or two or more preceding clock phases). For example, feedback circuit 330-*d* may be coupled with the output of third circuit 325-*c* (e.g., feedback signal 350-*c*) and the input of fourth circuit 325-*d* (e.g., signal 315-*d*). Feedback circuit 330-*d* may receive, from third circuit 325-*c* and/or the latch circuit 340-*c*, feedback signal 350-*c*. Feedback signal 350-*c* may indicate information about the voltage level of a preceding clock phase.

Feedback circuit 330-*d* may modify the signal 315-*d* input into fourth circuit 325-*d* based on feedback signal 350-*c*. In such cases, feedback circuit 330-*d* may equalize a multi-level signal. For example, feedback circuit 330-*d* may include weight circuit 355-*d*. Weight circuit 355-*d* may apply a different feedback signal to the signal. In some cases, weight circuit 355-*d* may include one or more tap circuits to weight the feedback signal 350-*c* according to a feedback parameter. The weight circuit 355-*d* may multiply the feedback signal 350-*c* by a tap weight. In some cases, the DFE tap value of the weight circuit 355-*d* (e.g., tap weight) may be controlled by the tail current of the tap circuits included in the weight circuit 355-*d*. For example, weight circuit 355-*d* may be coupled with sum circuit 335-*d* and latch circuit 340-*c* (e.g., to receive feedback signal 350-*c*). In some cases, feedback circuit 330-*d* may include a delay circuit. The delay circuit may delay the feedback signal at least one clock phase. In some cases, the delay circuit may be coupled with weight circuit 355-*d*. Feedback circuit 330-*d* may also utilize a full rate clock architecture.

In some cases, the feedback circuit 330-*d* coupled with an input of the first circuit 325-*a* and an output of the fourth circuit 325-*d* may be configured to modify the signal input into the first circuit 325-*a* based on the feedback signal 350-*d*. In such cases, the signal sent to the first circuit 325-*a* is modified based on comparing the signal with the reference voltages and determining the voltage level that occurs at the fourth clock phase.

Figure 4:
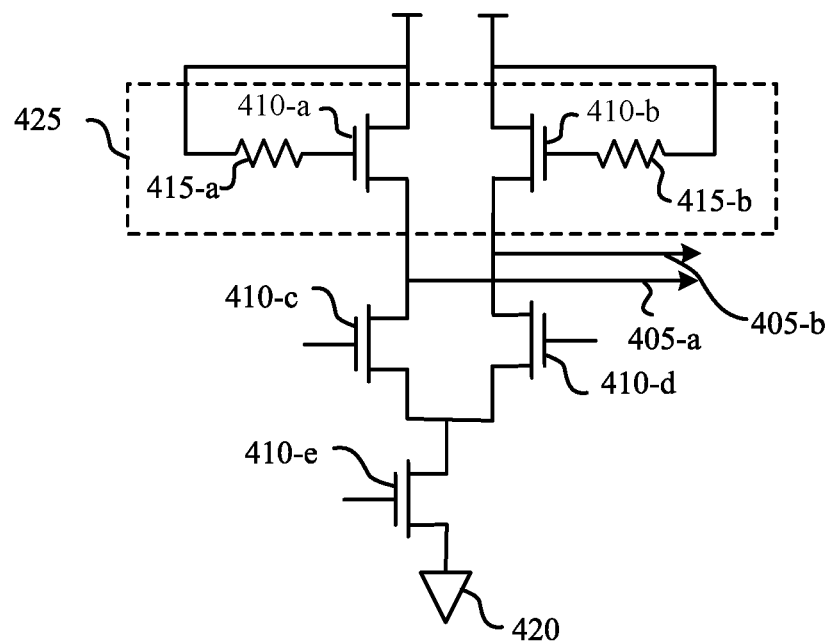
FIG. 4 illustrates an example of an amplifier that supports feedback for multi-level signaling in a memory device in accordance with examples as disclosed herein.

FIG. 4 illustrates an example of an amplifier 400 that supports feedback for multi-level signaling in a memory device in accordance with examples as disclosed herein. Amplifier 400 may be an example of amplifier 310-a, 310-b, 310-c, and 310-d as described with reference to FIG. 3. In some examples, the amplifier 400 may be configured to reduce the ISI associated with the signal. Each phase (e.g., circuit) of the receiver may include the amplifier 400. In such cases, the memory device may include four amplifiers 400.

The amplifier 400 may include switching components 410-a and 410-b and resistors 415-a and 415-b. Switching components 410-a and 410-b may each be an example of a transistor. In some cases, switching components 410-a and 410-b may be an example of a NMOS transistor. Switching components 410-a and 410-b may be an example of a transistor in an active inductor configuration. For example, the amplifier 400 may include a peaking circuit 425 where the peaking circuit 425 may include the switching component 410-a in series with the resistor 415-a, and the switching component 410-b in series with the resistor 415-b.

To compensate for the limited bandwidth available on the channel, the amplifier 400 may be configured to introduce inductive peaking. In such cases, the switching components 410-a and 410-b (e.g., NMOS active inductors) may implement the inductive peaking. The amplifier 400 may induce an active frequency boost to reduce the ISI. A falling edge of a data signal (e.g., waveform) may shift forward or backwards due to the dispersion in the pulse response (e.g., feedback signal), thereby resulting in ISI. A rising edge of a data signal (e.g., waveform) may shift forward or backwards due to the dispersion in the pulse response (e.g., feedback signal), thereby resulting in ISI. In some cases, an extended falling edge or rising edge of the data signal may occur due to a dispersion in the pulse response since the losses for the different signal frequencies may be different.

In such cases, the peaking circuit 425 may reduce a remaining energy of the extending falling edge of the data signal pulse (e.g., tailing energy). For example, the peaking circuit 425 may eliminate the ISI, thereby increasing an area of an eye diagram associated with signal. At lower operating frequencies, the amplifier 400 may reduce or eliminate the tailing energy. The reduction of the ISI may reduce an amount of energy in the following bit (e.g., a succeeding unit interval) In some cases, the amplifier 400 amplifies the signal and initially reduces the ISI before the signal is received at the circuit. The circuit and feedback circuits may then further reduce or eliminate the ISI. The peaking circuit 425 (e.g., including the switching components 410-a and 410-b and the resistors 415-a and 415-a) may partially or fully remove the ISI from the signal.

In some cases, the amplifier 400 may also include switching components 410-c. 410-d, and 410-e, and ground node 420. Switching components 410-c and 410-d may be an example of a transistor. Switching components 410-c and 410-d may operate in a saturation mode, may achieve differential gain, and may maintain similar equivalent impedance at the output nodes for the cases of switching high and low. In some cases, switching component 410-e may be an example of a NMOS transistor. In such cases, switching component 410-e may be an example of a current source biased at a voltage supplied by ground node 420.

The amplifier 400 may receive a first signal (e.g., a single-ended signal) at a gate of switching component 410-c and a second signal (e.g., a differential signal) at a gate of switching component 410-d. The second signal may be an example of a reference voltage. The amplifier 400 may then output a PAM4 differential signal. For example, the amplifier 400 may output differential signal 405-a (e.g., a P-signal) into a circuit coupled with the amplifier 400 (e.g., a sum circuit) and output differential signal 405-b (e.g., a N-signal) into the circuit coupled with the amplifier 400 (e.g., the sum circuit). In such cases, the amplifier 400 may be implemented before a feedback circuit. In some cases, the equalization of differential signals 405-a and 405-b may be implemented in current mode logic (CML). The differential signals may include a true signal (e.g., P-signal) and a complement signal (e.g., N-signal). In some examples, the amplifier 400 may output differential signals. For example, the amplifier 400 may output a differential signal into a circuit coupled with the amplifier 400 (e.g., a sum circuit) and output a differential signal into the circuit coupled with the amplifier 400 (e.g., the sum circuit).

Figure 5:
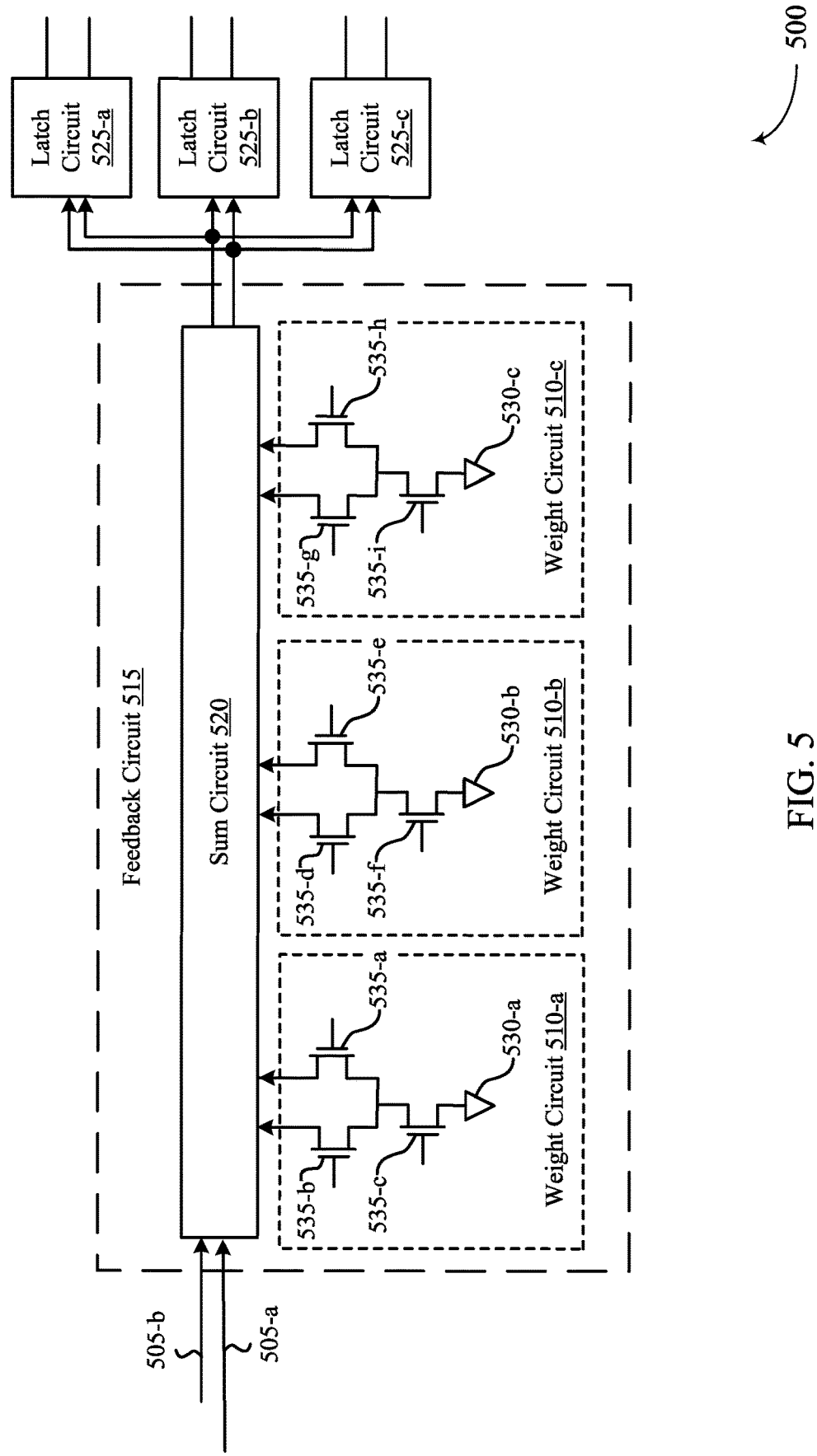
FIG. 5 illustrates an example of a circuit that supports feedback for multi-level signaling in a memory device in accordance with examples as disclosed herein.

FIG. 5 illustrates an example of a circuit 500 that supports feedback for multi-level signaling in a memory device in accordance with examples as disclosed herein. Circuit 500 may include feedback circuit 515 and latch circuits 525-a. 525-b, and 525-c, which may be examples of feedback circuits and latch circuits, respectively, as described with reference to FIG. 3. More specifically, the feedback circuit 515 may be an example of the feedback circuits 330-a. 330-b. 330-c, and 330-d described with reference to FIG. 3. Feedback circuit 515 may include sum circuit 520 and weight circuits 510-a. 510-b, and 510-c, which may be examples of sum circuit and weight circuits, respectively, as described with reference to FIG. 3.

Feedback circuit 515 may receive a PAM4 differential signal. For example, the feedback circuit 515 may receive differential signal 505-a (e.g., the P-signal) into sum circuit 520 and receive differential signal 505-b (e.g., the N-signal) into sum circuit 520. In some cases, the equalization of differential signals 505-a and 505-b may be implemented in current mode logic (CML). In some cases, one or more weight circuits 510 may be implemented in feedback circuit 515. For example, feedback circuit may include weight circuit 510-a. 510-b, and 510-c. Weight circuit 510-a may include, switching components 535-b, 535-a, and 535-c and ground node 530-a (e.g., a biasing voltage). Switching components 535-b and 535-a may be an example of a transistor. The switching component 535-c may be an example of a NMOS transistor. In some cases, tap weights (e.g., a weight applied to a feedback signal via weight circuit 510-a) may be implemented by varying the width of switching components 535-c, 535-f, and 535-i. Switching components 535-b and 535-a may be in electronic communication with sum circuit 520.

Each weight circuit 510-a, 510-b, or 510-c may be configured to amplify or attenuate a different feedback signal from the latch circuits 525-a, 525-b, or 525-c. When the feedback signals are differential signals, the P-signal may be fed into a gate of one switching component 535 (e.g., switching component 535-b, 535-d, or 535-g) and the N-signal may be fed into a gate of a different switching component 535 (e.g., switching component 535-a, 535-e, or 535-h). The amplification or attenuation of the feedback signals may be based on a size (e.g., a pull-down strength or a pull-up strength) of the switching components 535-c, 535-f, or 535-i. The feedback parameter may be configured to cause the value of the switching components 535-c, 535-f, or 535-i to change. In some cases, the parameters of each weight circuit 510-a, 510-b, or 510-c may be independently configurable. In other cases, the parameters of each weight circuit 510-a, 510-b, or 510-c may be related or the same. The feedback parameter may indicate values to changed or set in a mode register.

In some cases, the feedback signal received at weight circuit 510-a may be added to differential signals 505-a and 505-b or subtracted from differential signals 505-a and 505-b received at sum circuit 520. The subtraction of the feedback signal may be used in lossy channels. In some cases, an extended falling edge of the data signal may occur due to a dispersion in the pulse response. In some cases, feedback circuit 515 may reduce the ISI and improve the bit error rate (BER). For example, the ISI may be reduced by subtracting dispersed energy using feedback outputted by each latch circuit 525-a, 525-b, and 525-c. The feedback signal may be added to differential signals 505-a and 505-b at the input of each latch circuit 525-a, 525-b, and 525-c. In some cases, the feedback signal may be received at switching components 535-a, 535-b, 535-d, 535-e, 535-g, or 535-h. In accordance with examples as disclosed herein, the BER may be reduced, thereby improving the signal clarity. An eye diagram depicting results a feedback circuit implementation may show a larger eye height and eye width as compared to an eye diagram without implementation of a feedback circuit. For example, the feedback circuit implementation may show a 7.2% eye width increase and a 48% eye height increase.

Weight circuit 510-b may include switching component 535-f, switching components 535-d and 535-e, and ground node 530-b. Switching components 535-d and 535-e may be an example of a transistor. The switching component 535-f may be an example of a NMOS transistor. In some cases, tap weights (e.g., a weight applied to a feedback signal via weight circuit 510-b) may be implemented by varying the width of switching components 535-c, 535-f, and 535-i. Switching components 535-d and 535-e may be in electronic communication with sum circuit 520. In some cases, the feedback signal received at weight circuit 510-b may be added to differential signals 505-a and 505-b or subtracted from differential signals 505-a and 505-b received at sum circuit 520. For example, the feedback signal may be received at switching components 535-d and 535-e.

The weight circuit 510-c may include switching component 535-f, switching components 535-g and 535-h, and ground node 530-c. Switching components 535-g and 535-h may be an example of a transistor. The switching component 535-f may be an example of a NMOS transistor. In some cases, tap weights (e.g., a weight applied to a feedback signal via weight circuit 510-c) may be implemented by varying the width of switching components 535-c, 535-f, and 535-i. In some cases, the widths of switching components 535-c, 535-f, and 535-i may be equal to each other.

Switching components 535-g and 535-h may be in electronic communication with sum circuit 520. In some cases, the feedback signal received at weight circuit 510-c may be added to differential signals 505-a and 505-b or subtracted from differential signals 505-a and 505-b received at sum circuit 520. For example, the feedback signal may be received at switching components 535-g and 535-h.

In some cases, latch circuits 525-a, 525-b, and 525-c may receive the signal from sum circuit 520. For example, latch circuit 525-a may send a first feedback signal to weight circuit 510-a, latch circuit 525-b may send a second feedback signal different than the first feedback signal to weight circuit 510-b, and latch circuit 525-c may send a third feedback signal different than the first and second feedback signal to weight circuit 510-c.

The falling edge of the data signal (e.g., waveform) may shift forward or backwards due to the dispersion in the pulse response (e.g., feedback signal), thereby resulting in ISI. In such cases, the energy associated with the signal may interfere with the next symbol or bit. The feedback circuit 515 may reduce the ISI and reduce the remaining energy that may interfere with the subsequent symbol or bit. For example, the ISI may be reduced by subtracting dispersed energy using feedback outputted by each latch circuit 525-a, 525-b, and 525-c. In accordance with examples as disclosed herein, the ISI may be reduced, thereby improving the signal clarity and increasing a size of an area of an eye diagram. For example, the eye diagram depicting results of a feedback circuit implementation may show a larger eye height and eye width as compared to an eye diagram without implementation of a feedback circuit.

In some cases, circuit 500 may be an example of a single tap circuit. For example, weight circuit 510-a, 510-b, and 510-c may operate during a same time interval. Weight circuits 510-a, 510-b, and 510-c may modify (e.g., weight) a feedback signal. For example, weight circuit 510-a may modify the signal received from latch circuit 525-a and output the modified signal to the sum circuit 520 and back to the latch circuit 525-a. Weight circuit 510-b may modify the signal received from latch circuit 525-b and output the modified signal to the sum circuit 520 and back to the latch circuit 525-b. Weight circuit 510-c may modify the signal received from latch circuit 525-c and output the modified signal to the sum circuit 520 and back to the latch circuit 525-c. In such cases, the weight circuits 510 may reduce the remaining energy (e.g., the tailing energy) associated with the falling edge of the data signal.

Figure 6:
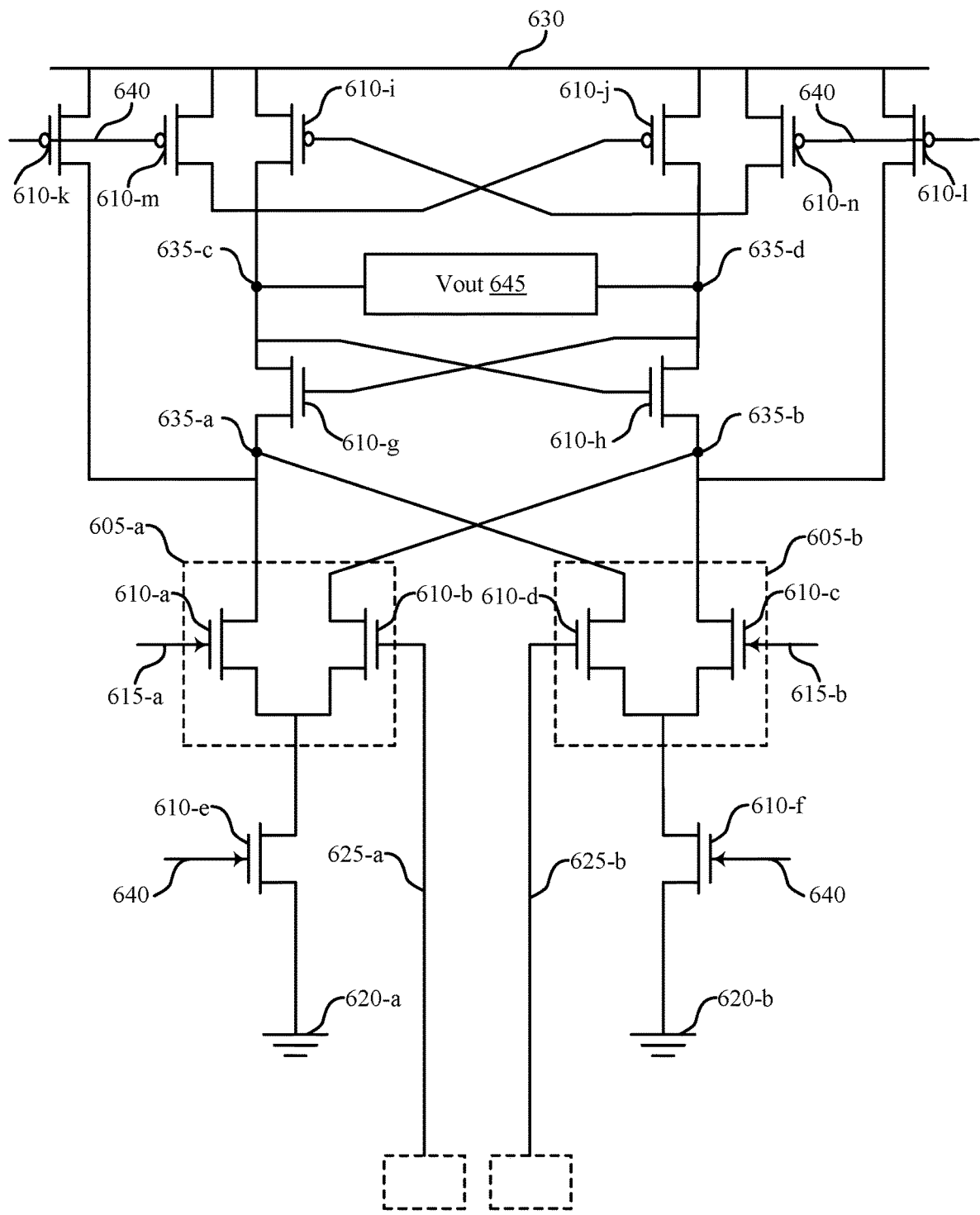
FIG. 6 illustrates an example of a latch circuit that supports feedback for multi-level signaling in a memory device in accordance with examples as disclosed herein.

FIG. 6 illustrates an example of a latch circuit 600 that supports feedback for multi-level signaling in a memory device in accordance with examples as disclosed herein. Latch circuit 600 may be an example at least one latch included in each of latch circuits 340-a, 340-b, 340-c, and 340-d described with reference to FIG. 3. In some examples, each latch circuit (e.g., latch circuit 340-a) may include three latch circuit blocks (e.g., circuits similar to latch circuits 525-a, 525-b, or 525-c described with reference to FIG. 5. Latch circuit 600 may compare a voltage level of a signal to a reference voltage. In some examples, the signal received at latch circuit 600 may be a PAM4 signal and/or a differential signal.

Latch circuit 600 may include first input circuit 605-a. The first input circuit 605-a may be configured to receive the P-signal or the N-signal from the sum circuit 335 or 520. For example, first input circuit 605-a may include switching component 610-a (e.g., first switching component). The switching component 610-a may be an example of an NMOS transistor. Switching component 610-a may receive first signal 615-a at the gate of the switching component 610-a. The first signal 615-a may be an example of a signal output from the sum circuit 335 or 520 described with reference to FIG. 3 or 5. The first signal 615-a may be an example of a differential signal and/or a PAM4 signal. The first signal 615-a may be a portion of a differential PAM4 signal. An amplifier circuit (e.g., amplifiers 310 described with reference to FIG. 3) may transmit first signal 615-a to first input circuit 605-a. For example, first signal 615-a may be transmitted to a gate of switching component 610-a. Latch circuit 600 may also include ground node 620-a. Ground node 620-a may be coupled to switching component 610-e. In such cases, switching component 610-e may control communication between first input circuit 605-a and ground node 620-a.

First input circuit 605-a may also include switching component 610-b (e.g., second switching component). The switching component 610-b may be an example of an NMOS transistor. Switching component 610-b may be configured to receive first control signal 625-*a*, which may be configured to tune the latch and thereby set, at least partially, the value of the reference voltage that is compared to the first signal 615-*a*. For example, first control signal 625-*a* may be transmitted to a gate of switching component 610-*b* to apply a bias to latch circuit 600.

Latch circuit 600 may include second input circuit 605-*b*. The second input circuit 605-*b* may be configured to receive the P-signal or the N-signal from the sum circuit 335 or 520. For example, second input circuit 605-*b* may include switching component 610-*c* (e.g., third switching component). The switching component 610-*c* may be an example of an NMOS transistor. Switching component 610-*c* may receive second signal 615-*b* at a gate of the switching component 610-*c*. The second signal may be an example of a signal output from the sum circuit 335 or 520 described with reference to FIG. 3 or 5. The second signal 615-*b* may be an example of a differential signal and/or a PAM4 signal. The second signal 615-*b* may be a portion of a differential PAM4 signal.

An amplifier circuit (e.g., amplifiers 310 described with reference to FIG. 3) may transmit second signal 615-*b* to second input circuit 605-*b*. For example, second signal 615-*b* may be transmitted to a gate of switching component 610-*c*. In some cases, latch circuit 600 may include ground node 620-*b*. Ground node 620-*b* may be coupled to switching component 610-*f*. In such cases, switching component 610-*f* may control communication between second input circuit 605-*b* and ground node 620-*b*.

Second input circuit 605-*b* may also include switching component 610-*d* (e.g., fourth switching component). The switching component 610-*d* may be an example of an NMOS transistor. Switching component 610-*d* may be configured to receive second control signal 625-*b* which may be configured to tune the latch and thereby set, at least partially, the value of the reference voltage that is compared to the second signal 615-*b*. For example, second control signal 625-*b* may be transmitted to a gate of switching component 610-*d* to apply a bias to latch circuit 600. In some examples, second control signal 625-*b* may be the same as first control signal 625-*a*. In other examples, second control signal 625-*b* may be different than first control signal 625-*a*.

Latch circuit 600 may include other circuitry for operation. The latch circuit 600 may include conductive line 630. Conductive line 630 may supply a voltage to latch circuit 600. Latch circuit 600 may also include a first pair of cross-coupled transistors. For example, the first pair of cross coupled transistors may include switching components 610-*g* and 610-*h*. Switching component 610-*g* and switching component 610-*h* may each be examples of an NMOS transistor. Latch circuit 600 may also include a second pair of cross-coupled transistors. For example, the second pair of cross coupled transistors may include switching components 610-*i* and 610-*j*. Switching component 610-*i* and switching component 610-*j* may each be examples of a PNMOS transistor.

Latch circuit 600 may also include switching components 610-*k*, 610-*l*, 610-*m*, and 610-*n*. Switching components 610-*k*, 610-*l*, 610-*m*, and 610-*n* may be examples of pre-charge switches. In some cases, switching components 610-*k*, 610-*l*, 610-*m*, and 610-*n* may be examples of PMOS transistors. Latch circuit 600 may also include input signal 640. Input signal 640 may be an example of a clock signal. In some cases, input signal 640 may be transmitted to the gates of switching components 610-*e*, 610-*f*, 610-*k*, 610-*l*, 610-*m*, and 610-*n*, or a combination thereof. Switching components 610-*k* and 610-*m* may each be examples of a PMOS transistor.

Latch circuit 600 may also include nodes 635-*a*, 635-*b*, 635-*c*, and 635-*d*. Nodes 635-*a*, 635-*b*, 635-*c*, and 635-*d* may each include a capacitor. For example, the capacitors may each be an example of a parasitic capacitor.

The latch circuit 600 may compare first signal 615-*a* to a reference voltage. Latch circuit 600 may then transmit a differential signal based on the comparison between first signal 615-*a* and the reference voltage. The reference voltage may be biased by first control signal 625-*a*. For example, switching component 610-*b* may receive first control signal 625-*a*, and may provide an additional discharge path for node 635-*b*. The additional discharge path for node 635-*b* may change the reference voltage. In some examples, the reference voltage may be set at 83% of a maximum operation voltage plus the lowest voltage level of the modulation scheme. The maximum operation voltage may refer to a full voltage swing of a signal modulated using the multi-level modulation scheme. For example, a modulation scheme where the highest voltage level is 2 volts and the lowest voltage level is 0.5 volts may have a maximum operation voltage of 2 volts. In other examples, the reference voltage may be set at 50% of a maximum operation voltage plus the lowest voltage level of the modulation scheme. In some cases, the reference voltage may be set at 17% of the maximum operation voltage plus the lowest voltage level of the modulation scheme.

The latch circuit 600 may compare second signal 615-*b* to a reference voltage. Latch circuit 600 may then transmit a differential signal based on the comparison between second signal 615-*b* and the reference voltage. The reference voltage may be biased by second control signal 625-*b*. For example, switching component 610-*d* may receive second control signal 625-*b*, and may provide an additional discharge path for node 635-*a*. The additional discharge path for node 635-*a* may change the reference voltage. In some examples, the reference voltage may be set at 17% of a maximum operation voltage plus the lowest voltage level of the modulation scheme. In other examples, the reference voltage may be set at 50% of a maximum operation voltage plus the lowest voltage level of the modulation scheme. In some examples, the reference voltage may be set at 83% of the maximum operation voltage plus the lowest voltage level of the modulation scheme. The reference voltage may be determined in accordance with a desired modulation scheme (e.g., PAM4 modulation scheme).

The input signal 640 may be a low clock signal. In such cases, switching components 610-*k*, 610-*l*, 610-*m*, and 610-*n* may each receive input signal 640. For example, switching component 610-*k* may receive input signal 640. The switching component 610-*k* may receive input signal 640 and allow communication between conductive line 630 and node 635-*a*. In such cases, node 635-*a* may be charged to the voltage of conductive line 630, and the parasitic capacitor at node 635-*a* may be charged to the voltage of conductive line 630. Switching component 610-*l* may receive input signal 640, and may allow communication between conductive line 630 and node 635-*b*. In such cases, node 635-*b* may be charged to the voltage of conductive line 630, and the parasitic capacitor at node 635-*b* may be charged to the voltage of conductive line 630.

Switching component 610-*m* may receive input signal 640, and may allow communication between conductive line 630 and node 635-*c*. In such cases, node 635-*c* may be charged to the voltage of conductive line 630, and the parasitic capacitor at node 635-*c* may be charged to the voltage of conductive line 630. In some cases, switching component 610-*n* may receive input signal 640, and may allow communication between conductive line 630 and node 635-*d*. In such cases, node 635-*d* may be charged to the voltage of conductive line 630, and the parasitic capacitor at node 635-*d* may be charged to the voltage of conductive line 630.

When input signal 640 is a low clock signal, the first pair of cross-coupled transistors (e.g., switching components 610-*g* and 610-*h*) may each be off (e.g., deactivated). In such cases, the gate voltage of each switching component 610-*g* and 610-*h* may be less than a threshold voltage of the activation of the switching components. The gate voltage may be an example of the gate to source voltage (e.g., Vgs). In other examples, the second pair of cross-coupled transistors (e.g., switching components 610-*i* and 610-*j*) may each be off (e.g., deactivated). In such cases, the gate voltage of each switching component 610-*i* and 610-*j* may be less than a threshold voltage of the activation of the switching components. The gate voltage may be an example of the gate to source voltage (e.g., Vgs).

The input signal 640 may be a high clock signal. In such cases, switching components 610-*k*, 610-*l*, 610-*m*, and 610-*n* may each receive input signal 640 and turn off. In other examples when input signal 640 is a high clock signal, the gate voltage of switching component 610-*a* may be greater than a threshold voltage of the activation of switching component 610-*a*. In such cases, switching component 610-*a* may turn on (e.g., activated). When input signal 640 is a high clock signal, the gate voltage of switching component 610-*c* may be greater than a threshold voltage of the activation of switching component 610-*c*. In such cases, switching component 610-*c* may turn on.

When input signal 640 is low, the voltage nodes 635-*a*, 635-*b*, 635-*c*, and 635-*d* may be precharged to a first voltage (e.g., Vdd). The parasitic capacitors of each voltage node 635-*a*. 635-*b*, 635-*c*, and 635-*d* may be charged up to the first voltage. When input signal 640 is high, the switching components 610-*k*, 610-*l*, 610-*m*, and 610-*n* may turn off. In such cases, switching components 610-*g*. 610-*i*, 610-*j*, and 610-*h* may be off due to gate to source voltage being less than a threshold voltage (e.g., Vt). Switching components 610-*a* and 610-*c* may turn on when the gate to source voltage is greater than the threshold voltage. When input signal 640 is a high clock signal, the voltages of nodes 635-*a* and 635-*b* may start to decrease. In such cases, the voltage of node 635-*a* may decrease due to the discharge effect of the parasitic capacitors at node 635-*a*. The voltage of node 635-*b* may decrease due to the discharge effect of the parasitic capacitor at node 635-*b*. In such cases, the voltage difference between nodes 635-*a* and 635-*b* may increase at a rate proportional to the difference between first signal 615-*a* and second signal 615-*b*.

The voltage difference between node 635-*a* and node 635-*b* may reach a value equal to the difference between the first voltage and a first set threshold voltage (e.g., Vthn). In such cases, the first cross-coupled pair of transistors (e.g., switching components 610-*g* and 610-*h*) may then turn on based on the gate to source voltage being greater than the first threshold voltage. The voltage difference between node 635-*c* and node 635-*d* may reach a value equal to the difference between the first voltage and a second set threshold voltage (e.g., Vthp). In such cases, the second cross-coupled pair of transistors (e.g., switching components 610-*i* and 610-*j*) may then turn on. A positive feedback may result in one of nodes 635-*c* or 635-*d* reaching the first voltage and another to 0 v. If the source to gate voltage of 610-*a* is more than the source to gate voltage of switching component 610-*c*, then the capacitance of node 635-*a* may discharge at a rate faster than the capacitance of node 635-*b*. In such cases, the capacitance of node 635-*c* may discharge at a rate faster than the capacitance of node 635-*d*. The voltage of node 635-*c* may be equal to zero and the voltage of node 635-*d* may be equal to the first voltage due to the feedback from cross coupled pairs.

A top and bottom latch may have different bias levels at nodes 635-*a* and 635-*b* due to the first control signal 625-*a* and second control signal 625-*b*, respectively. For the top latch, by setting the first control signal 625-*a* to be 0.65V and setting the second control signal 625-*b* to be 0V, the input signal 640 may be sliced at 0.83V at switching component 610-*e*, and the input signal 640 may be sliced at 0.17V at switching component 610-*f*. Switching component 610-*b* may create an additional discharge path for node 635-*b* and result in shifting down the threshold level compared to the other side (e.g., first control signal 615-*a*).

The feedback loop may be a positive feedback loop. For example, node 635-*d* may reach a voltage equal to the voltage of conductive line 630 and node 635-*c* may reach a voltage of zero volts. In some examples, node 635-*c* may reach a voltage equal to the voltage of conductive line 630 and node 635-*d* may reach a voltage of zero volts. In such cases, the gate voltage of switching component 610-*a* may be more than the gate voltage of switching component 610-*c*. The parasitic capacitor at node 635-*a* may discharge at a faster rate than the parasitic node at node 635-*b*. In some cases, the capacitance of node 635-*c* may discharge at a faster rate than the parasitic capacitor at node 635-*d*.

The latch circuit 600 may be configured to receive a differential signal (e.g., first signal 615-*a* and second signal 615-*b*) and output a differential signal to Vout 645, described below in further detail. In such cases, Vout 645 may be an example of a second latch configured to compare the voltage level of the signal to a second reference voltage. Vout 645 may be an example of a Set-Reset (SR) latch. In some cases, Vout 645 may output first signal 615-*a* and second signal 615-*b* to latch circuits (e.g., latch circuits 340 as described with reference to FIG. 3). The second latch may include a third input circuit and a fourth input circuit. In some cases, Vout 645 may be an example of a third latch configured to compare the voltage of the signal to a third reference voltage. The third latch may include a fifth input circuit and a sixth input circuit.

The memory device may include twelve latch circuits 600. In such cases, the four phase architecture may include three latch circuits 600 for each phase. The four phase architecture that may include four feedback blocks (e.g., circuits 325), where each feedback block may include three latches for detecting the three divisions in a PAM4 signal. In these architectures can be extended to include any quantity of taps (e.g., one, two, three, four, five, six, seven, eight). The quantity of latches in the feedback block may be based on the modulation scheme being used. For example, for PAM4 signals there are three divisions between four different symbols in the modulation scheme. These architectures can be modified to fit different modulation schemes with different quantities of symbols (e.g., modulation schemes with two symbols, three symbols, four symbols, five symbols, six symbols, seven symbols, and eight symbols). In some examples, a first latch circuit 600 may include three latches configured output a feedback signal to a second circuit (e.g., circuit 325-*b*), a second latch circuit 600 may include three latches configured to output a feedback signal to a third circuit (e.g., circuit 325-c), a third latch circuit 600 may include three latches configured to output a feedback signal to a fourth circuit (e.g., circuit 325-d), and a fourth latch circuit 600 may include three latches configured to output a feedback signal to a first circuit (e.g., circuit 325-a). The feedback configuration may be an example of a closed loop architecture. In such cases, the memory device may operate using a four phase architecture, thereby increasing the data rate of the memory device, reducing the operating frequency of components of the memory device, and reducing the overall size and cost of the memory device.

Figure 7:
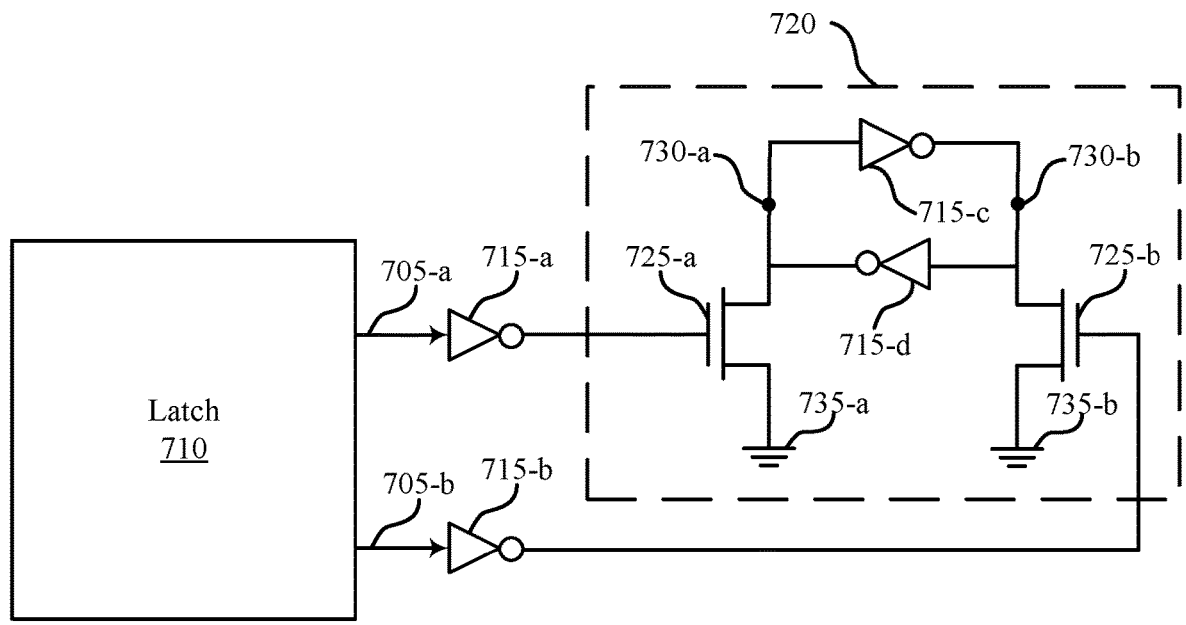
FIG. 7 illustrates an example of a latch circuit that supports feedback for multi-level signaling in a memory device in accordance with examples as disclosed herein.

FIG. 7 illustrates an example of a latch circuit 700 that supports feedback for multi-level signaling in a memory device in accordance with examples as disclosed herein. Latch circuit 700 may include latch 710 and 720. Latch 710 may be an example of latch circuit 600 described with reference to FIG. 6. Latch circuit 700 may be an example of latch circuits 340-a, 340-b, 340-c and 340-d described with reference to FIG. 3.

Latch 720 may be an example of a SR latch. In some cases, latch 720 may be configured to receive a signal from latch 710 and store data associated with the signal from latch 710. For example, latch 720 may receive first signal 705-a and second signal 705-b from latch 710. In such cases, first signal 705-a and second signal 705-b may each be an example of a voltage signals that may be modulated to contain binary voltage data.

Latch 720 may include switching component 725-a and switching component 725-b. The switching component 725-a and switching component 725-b may each be examples of an NMOS transistor. The switching component 725-a may receive first signal 705-a. In some cases, inverter 715-a may transmit first signal 705-a to switching component 725-a. In such cases, first signal 705-a may be transmitted to a gate of switching component 725-a. Switching component 725-b may receive second signal 705-b. In some cases, inverter 715-b may transmit second signal 705-b to switching component 725-b. In such cases, second signal 705-b may be transmitted to a gate of switching component 725-b.

Latch 720 may include inverter 715-c and inverter 715-d. In some cases, inverter 715-c may be cross-coupled to inverter 715-d. In such cases, inverter 715-c and inverter 715-d may be configured to store binary data from first signal 705-a and second signal 705-b, respectively. Latch 720 may also include node 730-a and node 730-b. Node 730-a may be coupled to the input of inverter 715-c and the output of inverter 715-d. Node 730-b may be coupled to the output of inverter 715-c and the input of inverter 715-d. In some examples, node 730-a and node 730-b may be configured to store binary data. For example, node 730-a and node 730-b may be configured to store complementary binary data from first signal 705-a and second signal 705-b, respectively.

In some cases, latch 720 may also include ground node 735-a and ground node 735-b. Ground node 735-a may be coupled to switching component 725-a where switching component 725-a may control communication between node 730-a and ground node 735-a. In some examples, ground node 735-b may be coupled to switching component 725-b where switching component 725-b may control communication between node 730-b and ground node 735-b.

The latch 720 may sample data from latch 710. In some examples, switching component 725-a and 725-b may sample data using a forcing methodology. The switching component 725-a may sample voltage data from first signal 705-a. Switching component 725-a may then transmit voltage data to node 730-a for storage. The switching component 725-b may sample voltage data from second signal 705-b. Switching component 725-b may then transmit voltage data to node 730-b for storage.

In some cases, a clock phase may occur when the latch 720 is fired. For example, the latch 710 may be comparing the incoming signal to a reference voltage on a consistent basis. The value output from the latch 710 may not include information that is useful for a decoder or useful for feedback. When the latch 720 is activated or fired, the latch 720 may store the value the signals being output from the latch 710. The timing of the activation may be configured to ensure that the latch is likely outputting valuable information at the time of activation.

If the voltage of first signal 705-a reaches a threshold voltage, node 730-a may be a first voltage value. If the voltage of first signal 705-a is below the threshold voltage, node 730-a may become a second voltage value. In some cases, the first voltage value may be higher than the second voltage value. For example, the first voltage value may be the voltage value of conductive line 630, as described in reference to FIG. 6. In some cases, the second voltage value may be zero volts. In other examples, if the voltage of first signal 705-b reaches a threshold voltage, node 730-b may be the first voltage value. If the voltage of second signal 705-b is below the threshold voltage, node 730-b may be a second voltage value. In some cases, the first voltage value may be higher than the second voltage value. For example, the first voltage value may be the voltage value of conductive line 630, as described in reference to FIG. 6. In some cases, the second voltage value may be zero volts.

In some cases, the memory device, including latch circuit 700, may operate using a four phase architecture. In such cases, the clock speed of the four phase architecture may be half the clock speed of a two phase architecture. Operating the memory device at a lower frequency may reduce the noise associated with the memory device and reduce a size of the transistors (e.g., switching components 725) associated with the memory device, thereby decreasing the size of the memory die.

Figure 8:
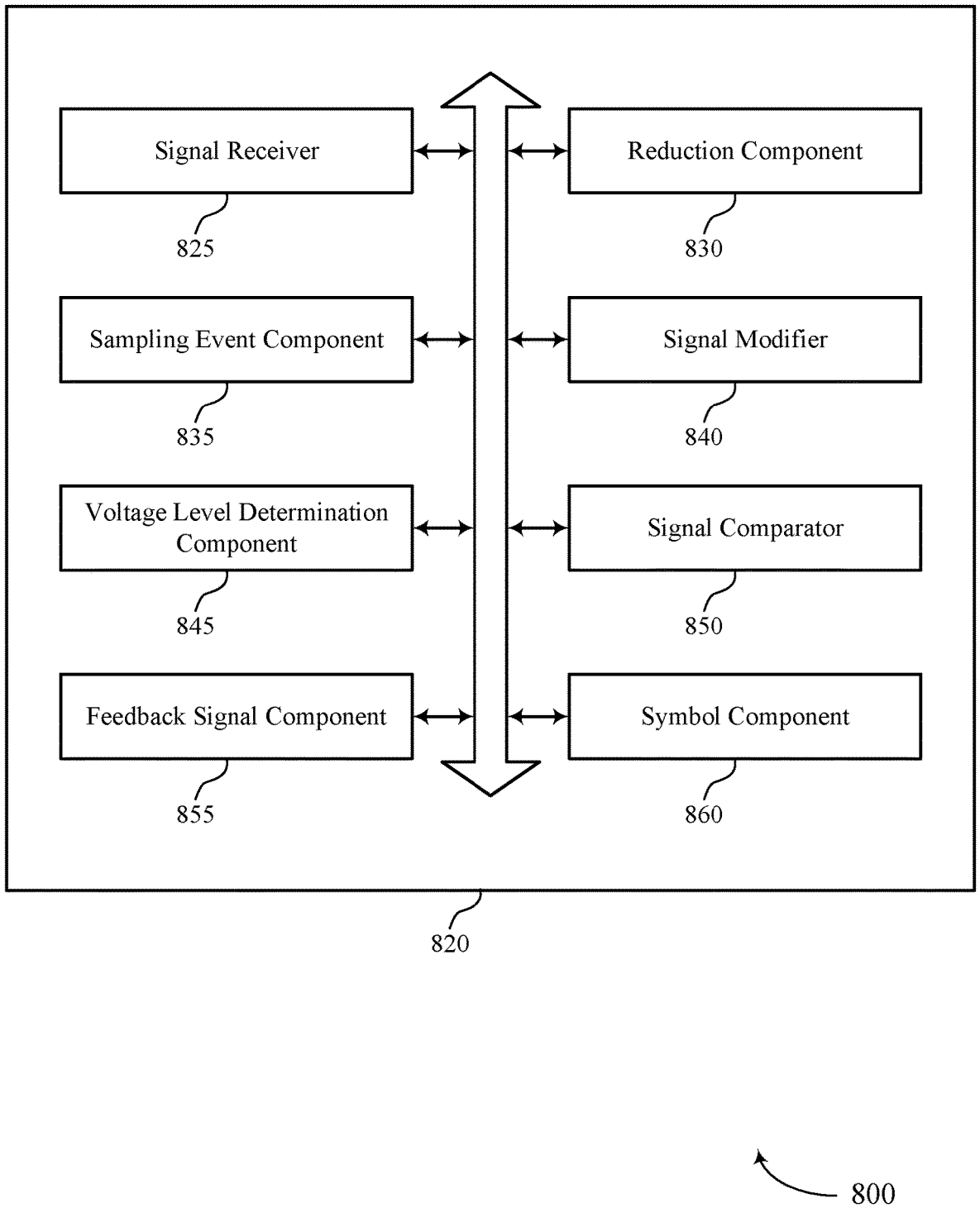
FIG. 8 shows a block diagram of a memory device that supports feedback for multi-level signaling in a memory device in accordance with examples as disclosed herein.

FIG. 8 shows a block diagram 800 of a memory device 820 that supports feedback for multi-level signaling in a memory device in accordance with examples as disclosed herein. The memory device 820 may be an example of aspects of a memory device as described with reference to FIGS. 1 through 7. The memory device 820, or various components thereof, may be an example of means for performing various aspects of feedback for multi-level signaling in a memory device as described herein. For example, the memory device 820 may include a signal receiver 825, a reduction component 830, a sampling event component 835, a signal modifier 840, a voltage level determination component 845, a signal comparator 850, a feedback signal component 855, and a symbol component 860, or any combination thereof. Each of these components may communicate, directly or indirectly, with one another (e.g., via one or more buses).

The signal receiver 825 may be configured as or otherwise support a means for receiving a signal modulated using a modulation scheme that includes three or more voltage levels. The reduction component 830 may be configured as or otherwise support a means for reducing, using an amplifier, inter-symbol interference between a first clock phase of the signal and a second clock phase of the signal. The sampling event component 835 may be configured as or otherwise support a means for determining, by a first circuit, a voltage level of the signal that occurs at the first clock phase based at least in part on reducing the inter-symbol interference. The signal modifier 840 may be configured as or otherwise support a means for modifying, by a first feedback circuit, the signal sent to a second circuit based at least in part on determining the voltage level that occurs at the first clock phase. The voltage level determination component 845 may be configured as or otherwise support a means for determining, by the second circuit, a voltage level of the signal that occurs at the second clock phase based at least in part on modifying the signal input into the second circuit.

In some examples, the signal modifier 840) may be configured as or otherwise support a means for modifying, by a second feedback circuit, the signal sent to a third circuit based at least in part on determining the voltage level that occurs at the second clock phase.

In some examples, the voltage level determination component 845 may be configured as or otherwise support a means for determining, by the third circuit, a voltage level of the signal that occurs at a third clock phase based at least in part on modifying the signal input into the third circuit. In some examples, the signal modifier 840 may be configured as or otherwise support a means for modifying, by a third feedback circuit, the signal sent to a fourth circuit based at least in part on determining the voltage level of the signal that occurs at the third clock phase.

In some examples, the voltage level determination component 845 may be configured as or otherwise support a means for determining, by the fourth circuit, a voltage level of the signal that occurs at a fourth clock phase based at least in part on modifying the signal input into the fourth circuit. In some examples, the signal modifier 840 may be configured as or otherwise support a means for modifying, by a fourth feedback circuit, the signal sent to the first circuit based at least in part on determining the voltage level that occurs at the fourth clock phase.

In some examples, to support reducing the inter-symbol interference, the signal receiver 825 may be configured as or otherwise support a means for receiving a single-ended signal over a channel coupled with a host device and a memory device. In some examples, to support reducing the inter-symbol interference, the signal receiver 825 may be configured as or otherwise support a means for outputting a first differential signal, a second differential signal, a third differential signal, and a fourth differential signal based at least in part on receiving the single-ended signal.

In some examples, to support determining the voltage level of the signal that occurs at the first clock phase, the signal comparator 850 may be configured as or otherwise support a means for comparing the signal that occurs at the first clock phase with a plurality of reference voltages, where modifying the signal sent to the second circuit is based at least in part on comparing the signal with the plurality of reference voltages.

In some examples, the feedback signal component 855 may be configured as or otherwise support a means for generating a first feedback signal based at least in part on comparing the signal that occurs at the first clock phase with the plurality of reference voltages. In some examples, the feedback signal component 855 may be configured as or otherwise support a means for sending the first feedback signal to the second circuit based at least in part on generating the first feedback signal.

In some examples, the feedback signal component 855 may be configured as or otherwise support a means for receiving, by a decoder, the first feedback signal. In some examples, the symbol component 860 may be configured as or otherwise support a means for determining a symbol associated with the signal transmitted during the first clock phase based at least in part on the first feedback signal.

In some examples, the signal communicated over the channel is communicated at a first frequency and the first circuit, the second circuit, a third circuit, and a fourth circuit each operate at a second frequency less than the first frequency associated with the signal communicated over a channel coupled with a host device and a memory device.

Figure 9:
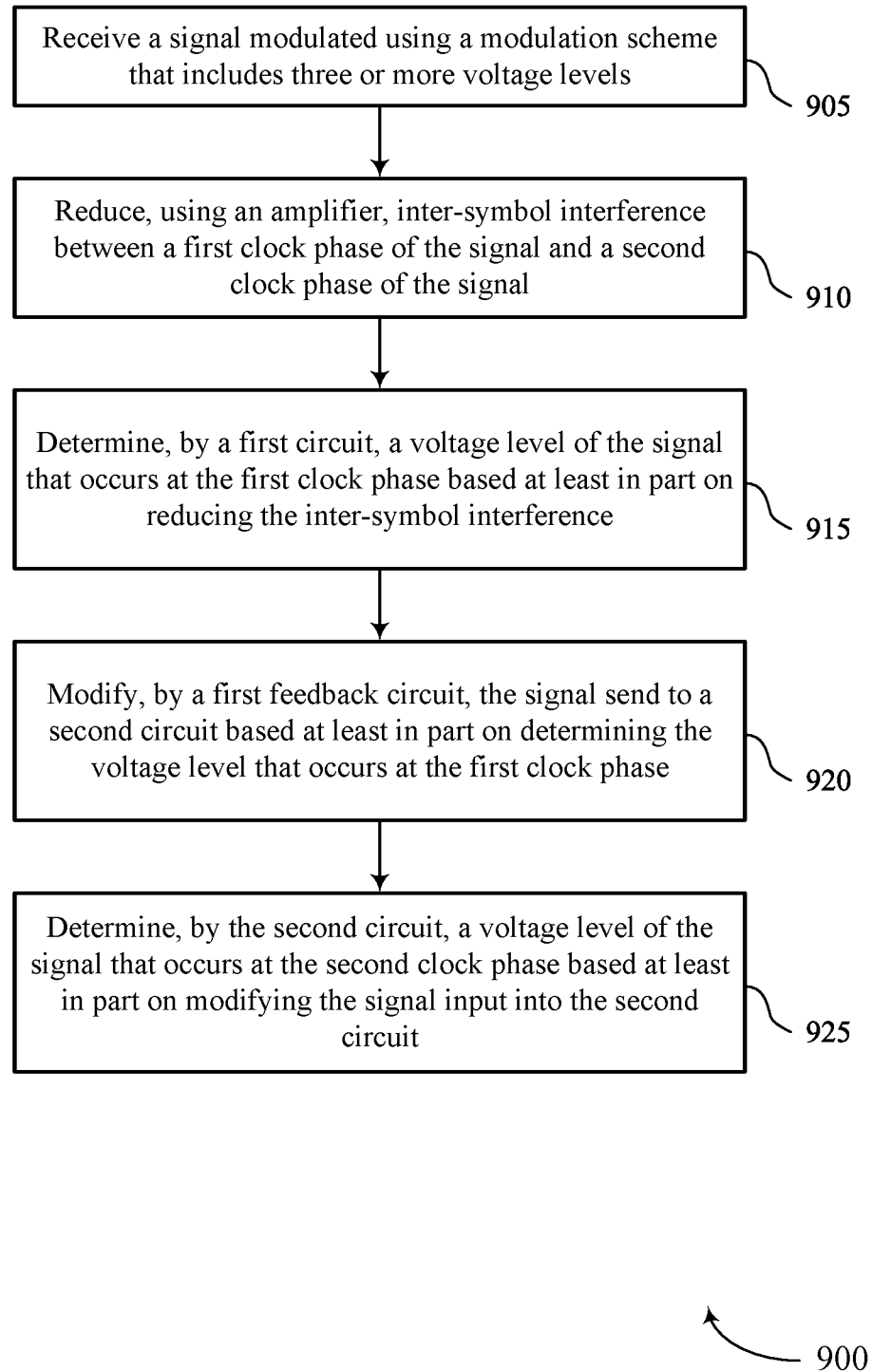
FIG. 9 shows a flowchart illustrating a method or methods that support feedback for multi-level signaling in a memory device in accordance with examples as disclosed herein.

FIG. 9 shows a flowchart illustrating a method 900 that supports feedback for multi-level signaling in a memory device in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include receiving a signal modulated using a modulation scheme that includes three or more voltage levels. The operations of 905 may be performed in accordance with examples as disclosed with reference to FIGS. 3 and 4. In some examples, aspects of the operations of 905 may be performed by a signal receiver 825 as described with reference to FIG. 8.

At 910, the method may include reducing, using an amplifier, inter-symbol interference between a first clock phase of the signal and a second clock phase of the signal. The operations of 910 may be performed in accordance with examples as disclosed with reference to FIGS. 3 and 4. In some examples, aspects of the operations of 910 may be performed by a reduction component 830 as described with reference to FIG. 8.

At 915, the method may include determining, by a first circuit, a voltage level of the signal that occurs at the first clock phase based at least in part on reducing the inter-symbol interference. The operations of 915 may be performed in accordance with examples as disclosed with reference to FIG. 3. In some examples, aspects of the operations of 915 may be performed by a sampling event component 835 as described with reference to FIG. 8.

At 920, the method may include modifying, by a first feedback circuit, the signal sent to a second circuit based at least in part on determining the voltage level that occurs at the first clock phase. The operations of 920 may be performed in accordance with examples as disclosed with reference to FIG. 3. In some examples, aspects of the operations of 920 may be performed by a signal modifier 840 as described with reference to FIG. 8.

At 925, the method may include determining, by the second circuit, a voltage level of the signal that occurs at the second clock phase based at least in part on modifying the signal input into the second circuit. The operations of 925 may be performed in accordance with examples as disclosed with reference to FIG. 3. In some examples, aspects of the operations of 925 may be performed by a voltage level determination component 845 as described with reference to FIG. 8.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving a signal modulated using a modulation scheme that includes three or more voltage levels, reducing, using an amplifier, inter-symbol interference between a first clock phase of the signal and a second clock phase of the signal, determining, by a first circuit, a voltage level of the signal that occurs at the first clock phase based at least in part on reducing the inter-symbol interference, modifying, by a first feedback circuit, the signal sent to a second circuit based at least in part on determining the voltage level that occurs at the first clock phase, and determining, by the second circuit, a voltage level of the signal that occurs at the second clock phase based at least in part on modifying the signal input into the second circuit.

Some examples of the method 900 and the apparatus described herein may further include operations, features, circuitry, logic, means, or instructions modifying, by a second feedback circuit, the signal sent to a third circuit based at least in part on determining the voltage level that occurs at the second clock.

Some examples of the method 900 and the apparatus described herein may further include operations, features, circuitry, logic, means, or instructions for determining, by the third circuit, a voltage level of the signal that occurs at a third clock phase based at least in part on modifying the signal input into the third circuit and modifying, by a third feedback circuit, the signal sent to a fourth circuit based at least in part on determining the voltage level of the signal that occurs at the third clock phase.

Some examples of the method 900 and the apparatus described herein may further include operations, features, circuitry, logic, means, or instructions for determining, by the fourth circuit, a voltage level of the signal that occurs at a fourth clock phase based at least in part on modifying the signal input into the fourth circuit and modifying, by a fourth feedback circuit, the signal sent to the first circuit based at least in part on determining the voltage level that occurs at the fourth clock phase.

In some examples of the method 900 and the apparatus described herein, reducing the inter-symbol interference may include operations, features, circuitry, logic, means, or instructions for receiving a single-ended signal over a channel coupled with a host device and a memory device and outputting a first differential signal, a second differential signal, a third differential signal, and a fourth differential signal based at least in part on receiving the single-ended signal.

In some examples of the method 900 and the apparatus described herein, determining the voltage level of the signal that occurs at the first clock phase may include operations, features, circuitry, logic, means, or instructions for comparing the signal that occurs at the first clock phase with a plurality of reference voltages, where modifying the signal sent to the second circuit may be based at least in part on comparing the signal with the plurality of reference voltages.

Some examples of the method 900 and the apparatus described herein may further include operations, features, circuitry, logic, means, or instructions for generating a first feedback signal based at least in part on comparing the signal that occurs at the first clock phase with the plurality of reference voltages and sending the first feedback signal to the second circuit based at least in part on generating the first feedback signal.

Some examples of the method 900 and the apparatus described herein may further include operations, features, circuitry, logic, means, or instructions for receiving, by a decoder, the first feedback signal and determining a symbol associated with the signal transmitted during the first clock phase based at least in part on the first feedback signal.

In some examples of the method 900 and the apparatus described herein, the signal communicated over the channel is communicated at a first frequency and the first circuit, the second circuit, a third circuit, a fourth circuit each operate at a second frequency less than the first frequency associated with the signal communicated over a channel coupled with a host device and a memory device.

It should be noted that the methods described herein describe possible implementations, and that the operations and the steps may be rearranged or otherwise modified and that other implementations are possible. Further, portions from two or more of the methods may be combined.

An apparatus is described. The apparatus may include a receiver coupled with a channel and configured to receive a signal modulated using a modulation scheme that includes three or more voltage levels, the receiver including a first circuit configured to determine a voltage level for a first clock phase of the signal modulated using the modulation scheme, a first feedback circuit coupled with an input of a second circuit and an output of the first circuit, the first feedback circuit configured to receive, from the first circuit, a first feedback signal indicating information about the voltage level of the first clock phase and modify the signal input into the second circuit based at least in part on the first feedback signal, the second circuit configured to determine a voltage level for a second clock phase of the signal based at least in part on the first feedback circuit modifying the signal, a second feedback circuit coupled with an input of a third circuit and an output of the second circuit, the second feedback circuit configured to receive, from the second circuit, a second feedback signal indicating information about the voltage level of the second clock phase and modify the signal input into the third circuit based at least in part on the second feedback signal, and the third circuit configured to determine a voltage level for a third clock phase of the signal based at least in part on the second feedback circuit modifying the signal In some examples of the apparatus, the receiver further includes a third feedback circuit coupled with an input of a fourth circuit and an output of the third circuit, the third feedback circuit configured to receive, from the third circuit, a third feedback signal indicating information about the voltage level of the third clock phase and modify the signal input into the fourth circuit based at least in part on the third feedback signal.

In some examples of the apparatus, the receiver further includes the fourth circuit configured to determine a voltage level for a fourth clock phase of the signal based at least in part on the third feedback circuit modifying the signal.

In some examples of the apparatus, the receiver further includes a fourth feedback circuit coupled with an input of the first circuit and an output of the fourth circuit, the fourth feedback circuit configured to receive, from the fourth circuit, a fourth feedback signal indicating information about the voltage level of the fourth clock phase and modify the signal input into the first circuit based at least in part on the fourth feedback signal.

In some examples of the apparatus, the receiver further includes a first amplifier coupled with the first circuit and the channel, the first amplifier including a peaking circuit configured to reduce inter symbol interference associated with the signal.

In some examples of the apparatus, the first amplifier may be configured to receive a single-ended signal over the channel and to output a first differential signal to the first circuit based at least in part on receiving the single-ended signal.

In some examples of the apparatus, the peaking circuit includes a transistor in an active inductor configuration.

In some examples of the apparatus, the receiver further includes a second amplifier coupled with the second circuit and the channel, the second amplifier including a peaking circuit configured to reduce the inter symbol interference associated with the signal, a third amplifier coupled with the third circuit and the channel, the third amplifier including a peaking circuit configured to reduce the inter symbol interference associated with the signal, and a fourth amplifier coupled with a fourth circuit and the channel, the fourth amplifier including a peaking circuit configured to reduce the inter symbol interference associated with the signal.

In some examples of the apparatus, the first circuit includes a plurality of latch circuits each configured to compare the signal to a different reference voltage of a plurality of reference voltages.

In some examples of the apparatus, each latch circuit of the plurality of latch circuits generates a different feedback signal based at least in part on comparing the signal to the different reference voltage, and the first feedback signal indicating information about the voltage level of the first clock phase includes a plurality of feedback signals generated by the plurality of latch circuits.

In some examples of the apparatus, at least one of the plurality of latch circuits includes a strongARM latch.

In some examples of the apparatus, the first circuit includes a decoder configured to receive a plurality of different feedback signals from the plurality of latch circuits and determine a symbol associated with the signal at the first clock phase based at least in part on the plurality of different feedback signals.

In some examples of the apparatus, the signal communicated over the channel is communicated at a first frequency and the first circuit, the second circuit, the third circuit, and a fourth circuit each operate at a second frequency less than the first frequency associated with the signal communicated over the channel.

Another apparatus is described. The apparatus may include a memory device, a controller coupled with the memory device and configured to cause the apparatus to receive a signal modulated using a modulation scheme that includes three or more voltage levels, reduce, using an amplifier, inter-symbol interference between a first clock phase of the signal and a second clock phase of the signal, determine, by a first circuit, a voltage level of the signal that occurs at the first clock phase based at least in part on reducing the inter-symbol interference, modify, by a first feedback circuit, the signal sent to a second circuit based at least in part on determining the voltage level that occurs at the first clock phase, and determine, by the second circuit, a voltage level of the signal that occurs at the second clock phase based at least in part on modifying the signal input into the second circuit In some examples of the apparatus, the controller may be further configured to cause the apparatus to modify, by a second feedback circuit, the signal sent to a third circuit based at least in part on determining the voltage level that occurs at the second clock phase.

In some examples of the apparatus, the controller may be further configured to cause the apparatus to determine, by the third circuit, a voltage level of the signal that occurs at a third clock phase based at least in part on modifying the signal input into the third circuit and modify, by a third feedback circuit, the signal sent to a fourth circuit based at least in part on determining the voltage level of the signal that occurs at the third clock phase.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary." used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. A dynamic random-access memory (DRAM) device, comprising:
   a receiver of a decision feedback equalization (DFE) circuit coupled with a Data In or Out (DQ) channel and configured to receive a signal, the receiver comprising a multi-phase architecture, and the receiver comprising:

a first slicer circuit configured to determine a voltage level at a first clock phase of the signal;

a first feedback circuit coupled with an input of a second slicer circuit and an output of the first slicer circuit, the first feedback circuit configured to receive a first feedback signal from the first slicer circuit and modify the signal input into the second slicer circuit based at least in part on a first parameter associated with a first mode register of the DRAM device;

the second slicer circuit configured to determine a voltage level at a second clock phase of the signal;

a second feedback circuit coupled with an input of a third slicer circuit and an output of the second slicer circuit, the second feedback circuit configured to receive a second feedback signal from the second slicer circuit and modify the signal input into the third slicer circuit based at least in part on a second parameter associated with a second mode register of the DRAM device; and the third slicer circuit configured to determine a voltage level at a third clock phase of the signal.

2. The DRAM device of claim 1, wherein the receiver further comprises:

a third feedback circuit coupled with an input of a fourth slicer circuit and an output of the third slicer circuit, the third feedback circuit configured to receive a third feedback signal from the third slicer circuit and modify the signal input into the fourth slicer circuit based at least in part on a third parameter associated with a third mode register of the DRAM device.

3. The DRAM device of claim 2, wherein the receiver further comprises:

the fourth slicer circuit configured to determine a voltage level at a fourth clock phase of the signal.

4. The DRAM device of claim 3, wherein the receiver further comprises:

a fourth feedback circuit coupled with an input of the first slicer circuit and an output of the fourth slicer circuit, the fourth feedback circuit configured to receive a fourth feedback signal from the fourth slicer circuit and modify the signal input into the first slicer circuit based at least in part on a fourth parameter associated with a fourth mode register of the DRAM device.

5. The DRAM device of claim 1, wherein:

the first feedback signal comprises information about the voltage level of the first clock phase; and the second feedback signal comprises information about the voltage level of the second clock phase.

6. The DRAM device of claim 1, wherein the receiver further comprises:

a first amplifier coupled with the first slicer circuit and the DQ channel, the first amplifier comprising a peaking circuit configured to reduce inter symbol interference associated with the signal.

7. The DRAM device of claim 6, wherein the first amplifier is configured to receive a single-ended signal over the DQ channel and to output a first differential signal to the first slicer circuit based at least in part on receiving the single-ended signal.

8. The DRAM device of claim 6, wherein the peaking circuit comprises a transistor in an active inductor configuration.

9. The DRAM device of claim 6, wherein the receiver further comprises:

a second amplifier coupled with the second slicer circuit and the DQ channel, the second amplifier comprising a peaking circuit configured to reduce the inter symbol interference associated with the signal;

a third amplifier coupled with the third slicer circuit and the DQ channel, the third amplifier comprising a peaking circuit configured to reduce the inter symbol interference associated with the signal; and a fourth amplifier coupled with a fourth slicer circuit and the DQ channel, the fourth amplifier comprising a peaking circuit configured to reduce the inter symbol interference associated with the signal.

10. The DRAM device of claim 1, wherein:

the first slicer circuit comprises a plurality of latch circuits each configured to compare the signal to a different reference voltage of a plurality of reference voltages; and each latch circuit of the plurality of latch circuits generates a different feedback signal based at least in part on comparing the signal to the different reference voltage, wherein the first feedback signal indicating information about the voltage level of the first clock phase comprises a plurality of feedback signals generated by the plurality of latch circuits.

11. The DRAM device of claim 10, wherein the first slicer circuit comprises a decoder configured to receive a plurality of different feedback signals from the plurality of latch circuits and determine a symbol associated with the signal at the first clock phase based at least in part on the plurality of different feedback signals.

12. The DRAM device of claim 1, wherein:

the signal communicated over the DQ channel is communicated at a first frequency; and the first slicer circuit, the second slicer circuit, the third slicer circuit, and a fourth slicer circuit each operate at a second frequency less than the first frequency associated with the signal communicated over the DQ channel.

13. A method, comprising:

reducing, using an amplifier associated with a decision feedback equalization (DFE) circuit of a dynamic random-access memory (DRAM) device coupled with a Data In or Out (DQ) channel of the DRAM device, inter-symbol interference between a first clock phase of a signal a second clock phase of the signal, and a third clock phase of the signal;

determining, by a first slicer circuit of the DFE circuit, a voltage level of the signal that occurs at the first clock phase based at least in part on reducing the inter-symbol interference;

modifying, by a first feedback circuit coupled with an input of a second slicer circuit and an output of the first slicer circuit, a first feedback signal sent to a second circuit based at least in part on a first parameter associated with a first mode register of the DRAM device;

determining, by the second slicer circuit, a voltage level of the signal that occurs at the second clock phase based at least in part on the first feedback signal;

modifying, by a second feedback circuit, a second feedback signal sent to a third slicer circuit based at least in part on a second parameter associated with a second mode register of the DRAM device; and determining, by the third slicer circuit, a voltage level of the signal that occurs at the third clock phase based at least in part on the second feedback signal.

14. The method of claim 13, further comprising:

modifying, by a third feedback circuit, a third feedback signal sent to a fourth slicer circuit based at least in part on a third parameter associated with a third mode register of the DRAM device.

15. The method of claim 14, further comprising:
    determining, by the fourth slicer circuit, a voltage level of the signal that occurs at a fourth clock phase based at least in part on the third feedback signal; and
    modifying, by a fourth feedback circuit, a fourth feedback signal sent to the first slicer circuit based at least in part on a fourth parameter associated with a fourth mode register of the DRAM device.

16. The method of claim 13, wherein reducing the inter-symbol interference further comprises:
    receiving a single-ended signal over the DQ channel coupled with a host device and the DRAM device; and
    outputting a first differential signal, a second differential signal, and a third differential signal.

17. The method of claim 13, wherein determining the voltage level of the signal that occurs at the first clock phase further comprises:
    comparing the signal that occurs at the first clock phase with a plurality of reference voltages, wherein modifying the signal sent to the second slicer circuit is based at least in part on comparing the signal with the plurality of reference voltages, the method further comprising:
        generating the first feedback signal based at least in part on comparing the signal that occurs at the first clock phase with the plurality of reference voltages;
        sending the first feedback signal to the second slicer circuit based at least in part on generating the first feedback signal;
        receiving, by a decoder, the first feedback signal; and
        determining a symbol associated with the signal transmitted during the first clock phase based at least in part on the first feedback signal.

18. The method of claim 13, wherein the signal is communicated at a first frequency, and wherein the first slicer circuit, the second slicer circuit, and the third slicer circuit each operate at a second frequency less than the first frequency associated with the signal communicated over the DQ channel coupled with a host device and the DRAM device.

19. An apparatus, comprising:
    a dynamic random-access memory (DRAM) device coupled with a Data In or Out (DQ) channel of the DRAM device; and
    processing circuitry coupled with the DRAM device and configured to cause the apparatus to:
        reduce, using an amplifier associated with a decision feedback equalization (DFE) circuit of the DRAM device, inter-symbol interference between a first clock phase of a signal a second clock phase of the signal, and a third clock phase of the signal;
        determining, by a first slicer circuit of the DFE circuit, a voltage level of the signal that occurs at the first clock phase based at least in part on reducing the inter-symbol interference;
        modifying, by a first feedback circuit coupled with an input of a second slicer circuit and an output of the first slicer circuit, a first feedback signal sent to a second circuit based at least in part on a first parameter associated with a first mode register of the DRAM device;
        determining, by the second slicer circuit, a voltage level of the signal that occurs at the second clock phase based at least in part on the first feedback signal;
        modifying, by a second feedback circuit, a second feedback signal sent to a third slicer circuit based at least in part on a second parameter associated with a second mode register of the DRAM device; and
        determining, by the third slicer circuit, a voltage level of the signal that occurs at the third clock phase based at least in part on the second feedback signal.

20. The apparatus of claim 19, wherein the processing circuitry is further configured to cause the apparatus to:
    modify, by a third feedback circuit, a third feedback signal sent to a fourth slicer circuit based at least in part on a third parameter associated with a third mode register of the DRAM device.

* * * * *